US012685045B2

(12) United States Patent
Haukka et al.

(10) Patent No.: US 12,685,045 B2
(45) **Date of Patent: *Jul. 14, 2026**

(54) DEPOSITION OF OXIDE THIN FILMS

(71) Applicant: ASM IP Holding B.V., Almere (NL)

(72) Inventors: Suvi P. Haukka, Helsinki (FI); Elina Färm, Helsinki (FI); Raija H. Matero, Helsinki (FI); Eva E. Tois, Espoo (FI); Hidemi Suemori, Helsinki (FI); Antti Juhani Niskanen, Helsinki (FI); Sung-Hoon Jung, Tempe, AZ (US); Petri Räisänen, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/914,767

(22) Filed: Oct. 14, 2024

(65) Prior Publication Data

US 2025/0037995 A1 Jan. 30, 2025

Related U.S. Application Data

(63) Continuation of application No. 17/814,161, filed on Jul. 21, 2022, now Pat. No. 12,154,785, which is a continuation of application No. 15/364,024, filed on Nov. 29, 2016, now Pat. No. 11,430,656.

(51) Int. Cl.

| | |
|---|---|
| ***H10P 14/60*** | (2026.01) |
| ***C23C 16/04*** | (2006.01) |
| ***C23C 16/40*** | (2006.01) |
| ***C23C 16/455*** | (2006.01) |
| ***H10P 14/692*** | (2026.01) |

(52) U.S. Cl.

CPC .......... *H10P 14/6339* (2026.01); *C23C 16/04* (2013.01); *C23C 16/042* (2013.01); *C23C 16/40* (2013.01); *C23C 16/403* (2013.01); *C23C 16/405* (2013.01); *C23C 16/45525* (2013.01); *H10P 14/6939* (2026.01); *H10P 14/69391* (2026.01); *H10P 14/69392* (2026.01); *H10P 14/69395* (2026.01); *H10P 14/69396* (2026.01)

(58) Field of Classification Search

CPC ......... C23C 16/40; C23C 16/18; C23C 16/04; C23C 16/45553; C23C 16/4408; H01L 21/02129; H01L 21/02181; H01L 21/02178; H01L 21/02175; H01L 21/0228

See application file for complete search history.

(56) References Cited

U.S. PATENT DOCUMENTS

2011/0120542 A1* 5/2011 Levy ........................ C23C 16/04 257/E31.119

2015/0217330 A1* 8/2015 Haukka ............... C23C 18/1208

* cited by examiner

*Primary Examiner* — Kelly M Gambetta

(74) *Attorney, Agent, or Firm* — Banner & Witcoff, Ltd.

(57) ABSTRACT

Methods are provided herein for deposition of oxide films. Oxide films may be deposited, including selective deposition of oxide thin films on a first surface of a substrate relative to a second, different surface of the same substrate. For example, an oxide thin film such as an insulating metal oxide thin film may be selectively deposited on a first surface of a substrate relative to a second, different surface of the same substrate. The second, different surface may be an organic passivation layer.

13 Claims, 14 Drawing Sheets

DEPOSITION OF OXIDE THIN FILMS

CROSS REFERENCE TO PRIORITY APPLICATION

The present application is a continuation of U.S. patent application Ser. No. 17/814,161 filed Jul. 21, 2022, which is a continuation of U.S. patent application Ser. No. 15/364,024 filed Nov. 29, 2016 now U.S. Pat. No. 11,430,656, the disclosure of which is hereby incorporated by reference in its entirety herein and for all purposes.

BACKGROUND

Field

The present disclosure relates generally to the field of vapor phase deposition, particularly cyclical vapor deposition of oxide materials.

Description of the Related Art

Integrated circuits are currently manufactured by an elaborate process in which various layers of materials are sequentially constructed in a predetermined arrangement on a semiconductor substrate.

The predetermined arrangement of materials on a semiconductor substrate is often accomplished by deposition of a material over the entire substrate surface, followed by removal of the material from predetermined areas of the substrate, such as by deposition of a mask layer and subsequent selective etching process.

In certain cases, the number of steps involved in manufacturing an integrated surface on a substrate may be reduced by utilizing a selective deposition process, wherein a material is selectively deposited on a first surface relative to a second surface without the need, or with reduced need for subsequent processing. In various contexts, selectivity can be useful to differentiate amounts of deposition on different surfaces of the same part, or to differentiate deposition on different parts.

Oxide materials, whether selectively formed or blanket deposited, are useful in a variety of contexts, including semiconductor fabrication. In many contexts, it is useful to form uniform, thin layers of oxide.

SUMMARY

According to some aspects, methods for selectively depositing thin films on a first surface of a substrate relative to a second surface are disclosed. In some embodiments a method can comprise contacting the substrate with a first vapor phase precursor, exposing the substrate to a purge gas or vacuum after contacting the substrate with the first vapor phase precursor, and contacting the substrate with a second vapor phase precursor comprising molecular oxygen ($O_2$) after exposing the substrate to the purge gas or vacuum. In some embodiments the thin film may comprise an insulating metal oxide. In some embodiments the second surface may comprise organic species.

In some embodiments the first surface is a substantially different material from the second surface. In some embodiments a method may further comprise exposing the substrate to a purge gas or vacuum after contacting the substrate with a second vapor phase precursor comprising molecular oxygen. In some embodiments the second surface may comprise a self-assembled monolayer (SAM). In some embodiments a thickness or amount of the thin film deposited on the second surface is less than about 50% of a thickness or amount of the thin film selectively deposited on the first surface of the substrate.

In some embodiments the first vapor phase precursor may comprise an organometallic compound. In some embodiments the first vapor phase precursor may comprise magnesium, lanthanum, hafnium, zirconium, aluminum, yttrium, scandium, a lanthanide, or a transition metal. In some embodiments the first vapor phase precursor may comprise bis(cyclopentadienyl)magnesium ($Mg(Cp)_2$). In some embodiments the first vapor phase precursor may comprise lanthanum formamidinate ($La(FAMD)_3$). In some embodiments the first vapor phase precursor may comprise tetramethylethyl alkylamide hafnium (TEMAH). In some embodiments the second vapor phase precursor does not comprise an additional compound comprising oxygen.

In some embodiments contacting the substrate with the second vapor phase precursor comprising molecular oxygen does not degrade or oxidize the second surface of the substrate. In some embodiments the thin film is deposited at a temperature of from about 100° C. to about 500° C.

According to some aspects methods for depositing a magnesium oxide, lanthanum oxide, or hafnium oxide thin film on a surface of a substrate are disclosed. In some embodiments a method can comprise contacting the substrate with a first vapor phase precursor comprising magnesium, lanthanum, or hafnium, exposing the substrate to a purge gas or vacuum, and contacting the substrate with a second vapor phase precursor comprising molecular oxygen ($O_2$) after exposing the substrate to the purge gas or vacuum. In some embodiments a method may further comprise exposing the substrate to a purge gas or vacuum after contacting the substrate with the second vapor phase precursor.

In some embodiments the substrate may comprise a first surface and a second, substantially different surface and magnesium oxide, lanthanum oxide, or hafnium oxide may be selectively deposited on the first surface of the substrate relative to the second, substantially different surface. In some embodiments the second surface of the substrate comprises organic species. In some embodiments the first vapor phase precursor comprising magnesium, lanthanum, or hafnium comprises at least one cyclopentadienyl (Cp) ligand. In some embodiments the second vapor phase precursor comprising molecular oxygen does not comprise any other compounds comprising oxygen. In some embodiments the magnesium oxide, lanthanum oxide, or hafnium oxide thin film is selectively deposited on a first surface of the substrate relative to a second surface of the substrate, wherein the second surface is organic.

BRIEF DESCRIPTION OF THE DRAWINGS

The invention will be better understood from the Detailed Description and from the appended drawings, which are meant to illustrate and not to limit the invention, and wherein.

DETAILED DESCRIPTION

Figure 1:
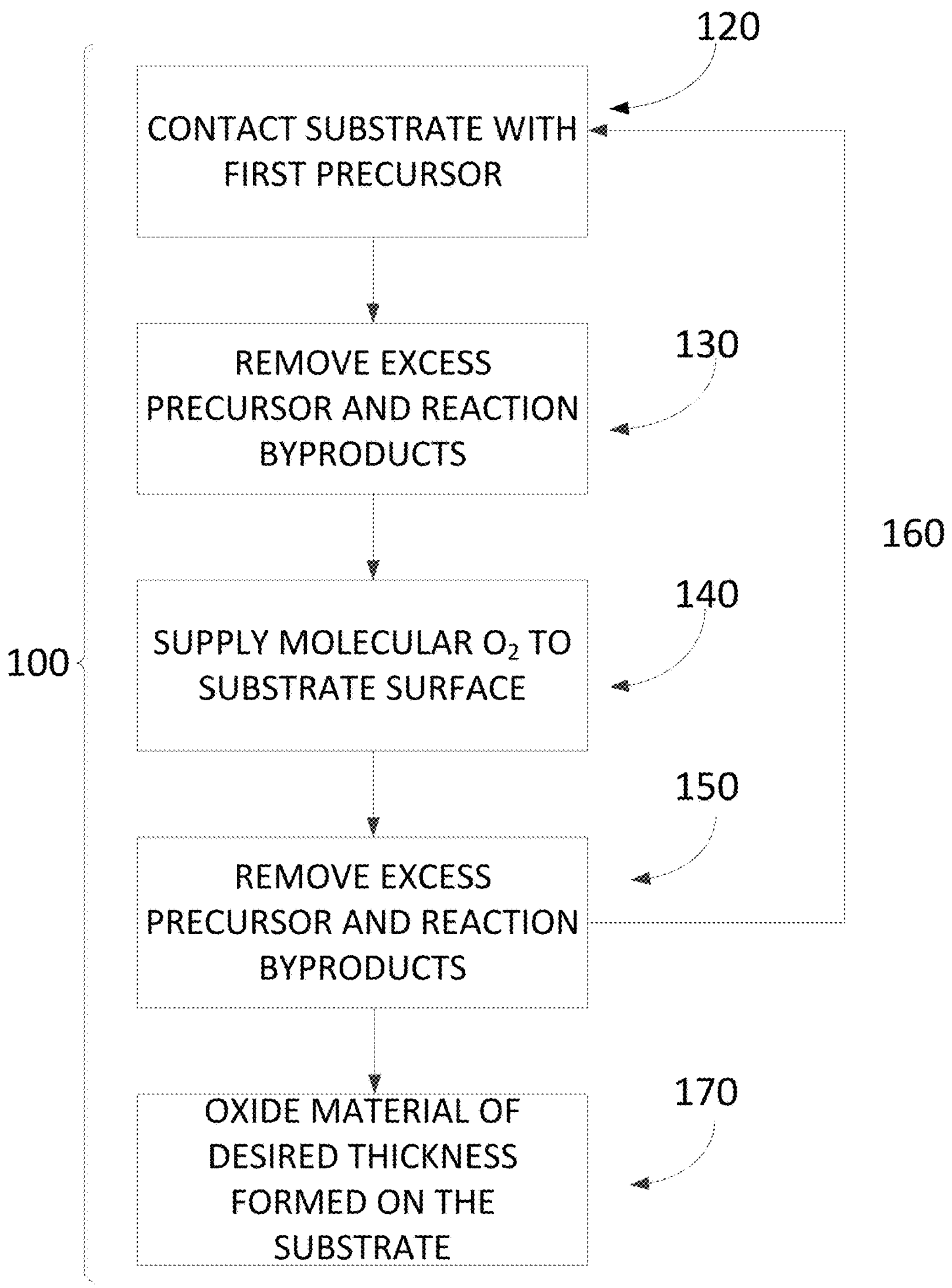
FIG. 1 is a process flow diagram generally illustrating processes for depositing an oxide film.

In the case of oxide thin films, vapor deposition process such as atomic layer deposition (ALD) and chemical vapor deposition (CVD) can be used to achieve deposition. Typically these processes include an oxygen-containing reactant such as ozone ($O_3$), oxygen containing plasma, or water ($H_2O$), however in a selective deposition process the concentration of an $O_3$ or $H_2O$ reactant may be difficult to control and an $O_3$ or $H_2O$ reactant may be difficult to remove from the reaction chamber. Further, $O_3$, or oxygen plasma, for example, may destroy or oxidize a second surface or passivation layer on which deposition is not desired.

According to some aspects of the present disclosure, selective deposition can be used to deposit an oxide material on a first surface of a substrate relative to a second surface. In some embodiments the selective deposition process may be a vapor deposition process, for example a deposition process utilizing chemical reactions between a substrate surface and one or more precursors or reactants, for example an atomic layer deposition type process. In some embodiments, the vapor deposition process can be a thermal deposition process. In some embodiments the selective deposition process may be a cyclical deposition process, for example an ALD process or cyclical CVD process. In some embodiments the selective deposition process may include an oxygen-containing reactant comprising molecular $O_2$. In some embodiments the selectively deposited oxide material may comprise an oxide thin film. In some embodiments the selectively deposited oxide material may comprise a metal oxide, for example a dielectric or an insulating metal oxide such as lanthanum oxide, hafnium oxide, zirconium oxide, magnesium oxide, a transition metal oxide, or aluminum oxide. In some embodiments the deposited metal oxide material does not comprise a substantial amount, if any, of a noble metal, such as Ru. In some embodiments the deposited metal oxide material is not substantially conductive. In some embodiments the deposited metal oxide material has a resistivity of greater than about 10,000 μΩ·cm, or greater than about 1,000,000 μΩ·cm.

In some embodiments the first surface may comprise a metal or semimetal material. In some embodiments the first surface may comprise a metallic material. In some embodiments the first surface may comprise an oxidized metal or metallic material. For example, the first surface may comprise a metal or metallic material, including, but not limited to, materials such as metal nitride, metal silicide, metal carbide, or mixtures of the same, that has been oxidized on its surface. In some embodiments the first surface comprises one or more transition metals. In some embodiments the first surface comprises one or more of Al, Cu, Co, Ni, W, Nb, Fe. In some embodiments the first surface may comprise one or more noble metals, such as Ru. In some embodiments the first surface may comprise Zn, Fe, Mn, or Mo. In some embodiments the first surface may comprise a dielectric material. In some embodiments the first surface may comprise a semiconductor or metallic oxide, nitride, carbide, boride, silicate, or combination thereof. For example, the first surface may comprise one or more of $RuO_x$, $NbC_x$, $NbB_x$, $NiO_x$, $CoO_x$, $NbO_x$, $WNC_x$, TaN, or TiN.

In some embodiments the first surface may comprise a semiconductor material. In some embodiments the first surface may comprise silicon and/or germanium. For example, the first surface may comprise silicon nitride, silicon oxide, silicon carbide, or germanium oxide. In some embodiments the first surface may comprise a silicon dioxide surface. In some embodiments the first surface may comprise a mixture of two or more of the materials recited above.

In some embodiments an oxide material is selectively deposited on a first surface of a substrate relative to a second, different surface of the substrate. In some embodiments the second surface may comprise an organic surface. In some embodiments the second surface may comprise a polymer surface. For example, in some embodiments the second surface may comprise a polyimide, polyamide, polystyrene, polyuria, or other such polymer. In some embodiments the polymers may include dimers, trimers, polyurethanes, polythioureas, polyesters, or polyimines. In some embodiments the organic surface may comprise other polymeric forms or mixtures of the above materials. In some embodiments the second organic surface comprises graphene or another form of carbon. In some embodiments the organic material may comprise amorphous carbon. In some embodiments the amorphous carbon may contain hydrogen. In some embodiments the second organic surface comprises photoresist material. In some embodiments there is no hydrocarbon contamination of the surface, for example from the atmosphere.

In some embodiments the second surface may comprise a directed self-assembled layer (DSA), such as a block copolymer layer. In some embodiments the second surface may comprise a self-assembled monolayer (SAM). For example, in some embodiments the second surface may comprise a tricholoro(octadecyl)silane SAM. In some embodiments the second surface may serve as a passivation layer during selective deposition. In some embodiments the second surface may comprise an organic passivation material, for example the second surface may comprise benzotriazole (BTA). In some embodiments the second surface may comprise organic species which can serve to passivate the second surface during selective deposition. In some embodiments the second surface may not be a continuous or closed layer. In some embodiments, the second surface may comprise a resist, such as photoresist. That is, in some embodiments the second surface may comprise a light sensitive material capable of being used in, for example, photolithography or photoengraving processes. For example, in some embodiments the second surface may comprise a photoresist capable of being used in an extreme ultraviolet lithography process, otherwise referred to as an EUV resist. In some embodiments the second surface may comprise a photoresist capable of being used in an immersion lithography process, for example a photoresist capable of being used in an immersion lithography process using light at a wavelength of 193 nm, otherwise referred to as a 193i resist.

In some embodiments a second material, such as a passivation layer, organic species or material, and/or SAM may be deposited on a portion of a first surface of a substrate in order to form a second, different surface. In some embodiments the second surface may comprise an organic material or organic species and the first surface may not comprise an organic material or organic species.

In some embodiments where the second surface comprises an organic surface, such as a passivation layer, a selective deposition process may remove or degrade less than about 40%, less than about 30%, less than about 20%, less than about 10%, less than about 5%, or less than about 1% of the organic surface as measured by the thickness of the organic surface. In some embodiments a selective deposition process may not remove or degrade substantially any material from the organic surface. In some embodiments an organic second surface, such as a passivation layer, may not be substantially removed or degraded by a selective deposition process including $O_2$ as an oxygen-containing reactant, as compared to a similar deposition process including $O_3$, oxygen-containing plasma, and/or $H_2O$ as an oxygen-containing reactant.

Selectivity

Selectivity can be given as a percentage calculated by [(deposition on first surface)−(deposition on second surface)]/(deposition on the first surface). Deposition can be measured in any of a variety of ways. In some embodiments deposition may be given as the measured thickness of the deposited material. In some embodiments deposition may be given as the measured amount of material deposited.

In some embodiments where deposition is measured as the thickness of material deposited and selectivity is a ratio of thicknesses on the different surfaces, selectivity is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity can change over the duration or thickness of a deposition.

In some embodiments where deposition is measured as the amount of material deposited and selectivity is a ratio of the amount of material deposited on the different surfaces, selectivity is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity can change over the duration or amount of material deposited over the course of a deposition.

In some embodiments deposition only occurs on the first surface and does not occur on the second surface. In some embodiments deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In some embodiments the deposition on the first surface of the substrate relative to the second surface of the substrate is at least about 10% selective, which may be selective enough for some particular applications. It will be understood by the skilled artisan that even partial selectivity in deposition can easily provide full selectivity in the resultant layers. For example, if 20 nm of a material is deposited on a first surface, and only 1 nm is deposited on the second surface, a subsequent brief etch (e.g., an isotropic wet etch) can remove all of the material from over the second surface with only slight percentage removal of the material from over the first surface. Additionally or alternatively, when the second surface comprises a passivation layer to minimize deposition thereover, removal of the passivation layer can undercut and remove any of the deposited material thereover.

In some embodiments the oxide film selectively deposited on the first surface of the substrate may have a thickness less than about 50 nm, less than about 20 nm, less than about 10 nm, less than about 5 nm, less than about 3 nm, less than about 2 nm, or less than about 1 nm, while a ratio of material deposited on the first surface of the substrate relative to the second surface of the substrate may be greater than or equal to about 2:1, greater than or equal to about 20:1, greater than or equal to about 15:1, greater than or equal to about 10:1, greater than or equal to about 5:1, greater than or equal to about 3:1, or greater than or equal to about 2:1.

In some embodiments a cyclical selective deposition process including $O_2$ as an oxygen-containing reactant may have an initial selectivity above a desired level, for example above 50% selectivity for a first deposition cycle. In some embodiments a cyclical selective deposition process including $O_2$ as an oxygen-containing reactant may maintain selectivity above the desired level, for example above 50% selectivity, for more subsequent deposition cycles as compared to a similar deposition process including $O_3$, oxygen-containing plasma, and/or $H_2O$ as an oxygen-containing reactant. In some embodiments a cyclical selective deposition process including $O_2$ as an oxygen-containing reactant may maintain selectivity above a desired level for 25% more cycles, 50% more cycles, 75% more cycles, or 100% more cycles or more cycles than a similar deposition process including $O_3$, oxygen-containing plasma, and/or $H_2O$ as an oxygen-containing reactant.

In some embodiments a cyclical selective deposition process including $O_2$ as an oxygen-containing reactant may be able to achieve a higher level of selectivity for one or more deposition cycles as compared to a similar selective deposition process including $O_3$, oxygen-containing plasma, and/or $H_2O$ as an oxygen-containing reactant. In some embodiments a selective deposition process including $O_2$ as an oxygen-containing reactant may have a selectivity 25% greater, 50% greater, 75%, 100% greater, or more than a similar selective deposition process including $O_3$, oxygen-containing plasma, and/or $H_2O$ as an oxygen-containing reactant.

Atomic Layer Deposition Type Processes

Atomic layer deposition (ALD) type processes are based on controlled, self-limiting surface reactions of precursor chemicals, or reactants. Gas phase reactions are avoided by alternately and sequentially contacting the substrate with the precursors. Vapor phase reactants are separated from each other on the substrate surface, for example, by removing excess reactants and/or reactant byproducts from substrate surface of interest between reactant pulses. In some embodiments one or more substrate surfaces are alternately and sequentially contacted with two or more vapor phase precursors, or reactants. Contacting a substrate surface with a vapor-phase reactant means that the reactant vapor is in contact with the substrate surface for a limited period of time. In other words, it can be understood that the substrate surface is exposed to each vapor phase reactant for a limited period of time.

Briefly, a substrate comprising at least a first surface and second, different surface is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the precursors being used and is generally at or below about 700° C., in some embodiments the deposition temperature is generally at or above about 100° C. for thermal ALD, in some embodiments the deposition temperature is between about 150° C. and about 350° C., and in some embodiments the deposition temperature is between about 175° C. and about 300° C.

The surface of the substrate is contacted with a vapor phase first reactant or precursor. In some embodiments a pulse of vapor phase first reactant is provided to a reaction space containing the substrate (for example, time divided ALD). In some embodiments the substrate is moved to a reaction space containing vapor phase first reactant (for example, space divided ALD). Conditions can be selected such that no more than about one monolayer of the first reactant is adsorbed on the first surface of the substrate in a self-limiting manner. However, in some arrangements hybrid CVD/ALD, or cyclical CVD, processes can allow overlap of the different mutually reactive reactants over the substrate and thus can produce more than a monolayer per cycle. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

For ALD processes, in which overlap between the reactants is minimized or avoided, vapor phase precursors and/or vapor phase byproducts are removed from the substrate surface, such as by evacuating a chamber with a vacuum pump and/or by purging (for example, replacing the gas inside a reactor with an inert gas such as argon or nitrogen). Supply of the reactant to the substrate surface is typically stopped during the removal periods, and may be shunted to a different chamber or to a vacuum pump during the removal periods. Typical removal times are from about 0.05 to 20 seconds, from about 1 to 10 seconds, or from about 1 to 2 seconds. However, other removal times can be utilized if necessary, such as where highly conformal step coverage over extremely high aspect ratio structures or other structures with complex surface morphology is needed.

The surface of the substrate is contacted with a vapor phase second gaseous reactant or precursor. In some embodiments a pulse of a second gaseous reactant is provided to a reaction space containing the substrate. In some embodiments the substrate is moved to a reaction space containing the vapor phase second reactant. Excess second reactant and gaseous byproducts of the surface reaction, if any, are removed from the substrate surface. Contacting and removing are repeated until a thin film of the desired thickness has been selectively formed on the first surface of substrate, with each cycle leaving no more than about a molecular monolayer. Additional phases comprising alternately and sequentially contacting the surface of a substrate with other reactants can be included to form more complicated materials, such as ternary materials.

As mentioned above, each phase of each cycle can be self-limiting for ALD processes. An excess of reactant precursors is supplied in each phase to saturate the susceptible structure surfaces, for example the first surface of the substrate. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen, argon or another inert gas. In some embodiments purging can comprise turning off the flow of the reactive gas while continuing to flow an inert carrier gas to the reaction space.

The substrate can comprise various types of materials. When manufacturing integrated circuits, the substrate typically comprises a number of thin films with varying chemical and physical properties. For example and without limitation, the substrate may comprise a first layer and at least a second, different layer. In some embodiments the second, different layer may be a passivation or blocking layer. In some embodiments the second, different layer may be an organic layer.

The precursors employed in ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type, its surface area, and/or the size of the chamber the contacting time may be even higher than 10 seconds. Contacting times can be on the order of minutes in some cases, particularly for batch deposition processes on multiple substrates. The optimum contacting time can be determined by the skilled artisan based on the particular circumstances.

The mass flow rate of the precursors can also be determined by the skilled artisan. In some embodiments the flow rate of metal precursors is between about 1 and 1000 sccm without limitation, more particularly between about 100 and 500 sccm for a single wafer deposition reactor.

The pressure in a reaction chamber is typically from about 0.01 to about 20 mbar, or from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperature can be less than the crystallization temperature for the deposited materials such that an amorphous thin film is formed or it can be above the crystallization temperature such that a crystalline thin film is formed. The deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

In some embodiments, the substrate temperature is high enough to support thermal ALD for the reactants of interest, but low enough to avoid burning off an organic passivation layer to aid selectivity. For example, the growth temperature may be generally be greater than about 100° C. In some embodiments the growth temperature may be at or below about 700° C., at or below about 500° C., or at or below about 400° C. In some embodiments the growth temperature is between about 150° C. and about 500° C., in some embodiments the growth temperature is between about 150° C. and about 350° C., and in some embodiments the growth temperature is between about 175° C. and about 300° C.

Reactors capable of being used to grow thin films can be used for the deposition. Such reactors include ALD reactors, as well as CVD reactors equipped with appropriate equipment and means for providing the precursors. According to some embodiments, a showerhead reactor may be used.

Examples of suitable reactors that may be used include commercially available single substrate (or single wafer) deposition equipment such as Pulsar® reactors (such as the Pulsar® 2000 and the Pulsar® 3000), and the EmerALD® reactor, available from ASM America, Inc. of Phoenix, Arizona and ASM Europe B.V., Almere, Netherlands. Other commercially available reactors include those from ASM Japan K.K (Tokyo, Japan) under the tradename Eagle® XP and XP8.

In some embodiments a batch reactor may be used. Suitable batch reactors include, but are not limited to, Advance® 400 Series reactors commercially available from and ASM Europe B.V (Almere, Netherlands) under the trade names ALDA400™ and A412™. In some embodiments a vertical batch reactor is utilized in which the boat rotates during processing, such as the A412™. Thus, in some embodiments the wafers rotate during processing. In other embodiments, the batch reactor comprises a minibatch reactor configured to accommodate 10 or fewer wafers, 8 or fewer wafers, 6 or fewer wafers, 4 or fewer wafers, or 2 wafers. In some embodiments in which a batch reactor is used, wafer-to-wafer uniformity is less than 3% (1 sigma), less than 2%, less than 1% or even less than 0.5%.

The deposition processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run. Additionally, in a cluster tool it is possible to reduce the time to pump the reaction space to the desired process pressure levels between substrates.

A stand-alone reactor can be equipped with a load-lock. In that case, it is not necessary to cool down the reaction space between each run. In some embodiments a selective deposition process for depositing an oxide material, for example a metal oxide thin film may comprise a plurality of deposition cycles, for example ALD cycles. In some embodiments each ALD cycle comprises at least two distinct phases. Contacting the substrate with a first precursor and thereafter removing excess first precursor and reaction byproducts from the substrate surface may be considered a phase and may be referred to as a first phase, first precursor phase, metal phase, metal precursor phase, first metal phase, first metal precursor phase, etc. For a deposition cycle, in a first phase, the substrate is contacted with a first precursor which forms no more than about one monolayer on the substrate surface. The first phase can include the contacting period, also referred to as a supply period, and a removal (e.g., purging) period. In a second phase, the substrate is contacted with a second precursor comprising oxygen and may convert adsorbed first precursor to an oxide material, for example an insulating metal oxide such as lanthanum oxide or magnesium oxide. Contacting the substrate with a second precursor and thereafter removing excess second precursor and reaction byproducts from the substrate surface may be considered a phase and may be referred to as a second phase, second precursor phase, oxidation phase, oxygen phase, oxygen precursor phase, second oxygen phase, and/or second oxygen precursor phase. One or more of the precursors may be provided with the aid of a carrier gas, such as $N_2$, Ar, or He. Additional phases may be added and phases may be removed as desired to adjust the composition of the final film.

Referring to FIG. 1 and according to some embodiments an oxide material is selectively deposited on a substrate by a cyclical thermal vapor deposition process 100 comprising at least one cycle comprising:

contacting the substrate with a first vapor phase precursor at block 120;

removing any excess first precursor and reaction by products, if any, from the substrate at block 130;

supplying molecular oxygen ($O_2$) to the substrate surface in order to contact the substrate with a second vapor phase precursor comprising molecular oxygen ($O_2$) at block 140;

removing from the substrate, at block 150, any excess second precursor comprising molecular oxygen and/or any gaseous by-products, and;

optionally repeating at block 160 the contacting and removing blocks until an oxide material of the desired thickness has been formed at block 170 on the substrate.

In some embodiments the above described cyclical deposition may be an ALD type process. In some embodiments, the deposition may selectively form the oxide material on a first surface relative to a second surface. In one embodiment the first and second surfaces are on the same substrate. In another embodiment the first surface is on a substrate and the second surface is not on the same substrate than the first surface.

In some embodiments one or more surfaces of the substrate may be subjected to a pretreatment process prior to beginning the deposition process 100. In some embodiments a pretreatment process may enhance the selectivity of the selective deposition process 100. In some embodiments a pretreatment process may enhance deposition of an oxide material on one surface relative to one or more different surfaces prior to beginning the deposition process 100. In some embodiments a pretreatment process may inhibit deposition of an oxide material on one surface relative to one or more different surfaces prior to beginning the deposition process 100.

In some embodiments a pretreatment process may comprise forming a passivation or blocking layer on a portion of the substrate to thereby form a second surface on the substrate. In some embodiments the pretreatment process may comprise forming a DSA layer or a SAM layer on a portion of the substrate. In some embodiments the pretreatment may comprise forming a layer comprising an organic material, for example a polymer on a portion of the substrate.

In some embodiments a pretreatment process may be used to enhance the selectivity of the subsequent selective deposition process. In some embodiments a pretreatment process may enhance selective deposition of an oxide material on a first surface relative to a second different surface. In some embodiments a pretreatment process may enhance the selectivity of a subsequent selective deposition process by a factor of more than about 2, more than about 5, or more than about 10.

In some embodiments a pretreatment process may be performed in the same reaction chamber or reactor as the subsequent deposition process 100. In some embodiments a pretreatment process may be performed in a different reaction chamber or reactor than the subsequent deposition process 100.

Referring again to FIG. 1, the substrate is contacted with a first precursor at block 120. In some embodiments the first precursor is conducted into a reaction chamber in the form of vapor phase pulse and contacted with the surface of the substrate. Conditions can be selected such that no more than about one monolayer of the precursor is adsorbed on the first surface of the substrate in a self-limiting manner. However, in some embodiments conditions may be selected such that more than one monolayer of the material may be formed, for example due to decomposition of the precursors, but in some instances CVD gas phase reactions causing loss of selectivity are to be avoided.

The first precursor pulse can be supplied in vapor form. The first precursor gas is considered "volatile" for purposes of the present description if the species exhibits sufficient vapor pressure under the process conditions to transport the species to the workpiece in sufficient concentration to saturate exposed surfaces.

In some embodiments the first precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second.

The first precursor employed in the cyclical deposition processes may be solid, liquid, or gaseous material under standard conditions (room temperature and atmospheric pressure), but the first precursor is in vapor phase before it is conducted into the reaction chamber and contacted with the substrate surface. In some embodiments the first precursor may comprise a metal, such as magnesium, lanthanum, hafnium, zirconium, aluminum, or a transition metal.

At block 130 excess first precursor and reaction byproducts, if any, arc removed from the substrate surface, for example exposing the substrate to a purge gas or vacuum. In some embodiments removal of excess first precursor and any reaction byproducts can be accomplished by purging with a pulse of inert gas such as nitrogen or argon. During removal periods such as block 130, any vapor phase precursors and/or any vapor phase byproducts can be removed from the substrate surface by evacuating the reactor chamber with a vacuum pump and/or by purging the gas inside the reactor with an inert gas such as argon or nitrogen and/or by moving the substrate away from the supply of precursor. Typical removal times are from about 0.05 to 20 seconds, such as between about 1 and 10 seconds, and more particularly between about 1 and 2 seconds. However, other removal times can be utilized if desired, such as when depositing layers over extremely high aspect ratio structures or other structures with complex surface morphology is needed. The appropriate removal times can be readily determined by the skilled artisan based on the particular circumstances.

As noted above, in some embodiments, removing excess first precursor and reaction byproducts, if any, may comprise moving the substrate so that the first precursor no longer contacts the substrate. In some embodiments no precursor may be removed from the various parts of a chamber. In some embodiments the substrate is moved from a part of the chamber containing a first precursor to another part of the chamber containing a second precursor or no precursor at all. In some embodiments the substrate is moved from a first reaction chamber to a second, different reaction chamber. In some embodiments the substrate is exposed to first and second precursors in the same reaction chamber.

At block 140 molecular $O_2$ is supplied to the substrate surface in order to contact the substrate with a second vapor phase precursor comprising molecular oxygen. In some embodiments the second vapor phase precursor comprises molecular oxygen and is not excited prior to contacting the substrate. Thus, in some embodiments block 140 can comprise flowing molecular $O_2$ into the reaction chamber without passing through any in situ or ex situ excitation. In some embodiments block 140 can comprise supplying a flow of molecular $O_2$ to the substrate surface.

In some embodiments the second precursor is supplied to the substrate where it reacts with the first precursor bound to the surface of the substrate. In an ALD sequence, the reaction can form up to about a monolayer of an oxide material on the surface of the substrate. In some embodiments, however, more than one molecular layer of an oxide material is formed on the substrate, but in some instances CVD gas phase reactions causing loss of selectivity are to be avoided.

In some embodiments the second precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. However, depending on the reactor type, substrate type and its surface area, the second precursor contacting time may be even higher than 10 seconds, particularly for batch reactors or other processes in which very large surface areas are to be coated. In some embodiments, contacting times can be on the order of minutes. The optimum contacting time can be readily determined by the skilled artisan based on the particular circumstances.

The concentration of the second precursor in the reaction chamber may be from about 0.01% by volume to about 99.0% by volume. And the second precursor may flow through the reaction chamber at a rate of between about 1 standard $cm^3$/min and about 4000 standard $cm^3$/min.

At block 150, excess second precursor and gaseous byproducts of the surface reaction, if any, are removed from the substrate, as described above for block 130. In some embodiments excess precursor and reaction byproducts are removed with the aid of an inert gas. In some embodiments excess second precursor and any byproducts are removed by exposing the substrate to a purge gas or vacuum.

The acts of contacting and removing may be optionally repeated at block 160 until an oxide material of a desired thickness has been formed on the surface of the substrate, with each cycle leaving no more than about a molecular monolayer. In some cases, it might be desirable to achieve at least partial decomposition of at least one the various precursors. Thus, in some embodiments conditions may be selected such that more than one molecular layer of an oxide material is formed on the substrate in each deposition cycle but in some instances CVD gas phase reactions that cause a loss of selectivity are to be avoided. In some instances partial decomposition of at least one the various precursors may occur, which in some instances, without being bound to any one theory, may increase the reactivity of an at least partially decomposed precursor towards $O_2$.

The oxide material selective deposition processes of the present disclosure may comprise one or more cycles. Some embodiments involve the repetition of at least about 5 cycles, at least about 10 cycles, at least about 50 cycles, at least about 100 cycles, at least about 200 cycles, or at least about 300 cycles or more.

According to some embodiments, deposited thin films deposited using $O_2$ may exhibit step coverage and pattern loading effects of greater than about 50%, greater than about 80%, greater than about 90%, or greater than about 95%. In some cases step coverage and pattern loading effects can be greater than about 98% and in some case about 100% (within the accuracy of the measurement tool or method. These values can be achieved in features with aspect ratios of 2 or greater, in some embodiments in aspect ratios of about 3 or greater, in some embodiments in aspect ratios of about 5 or greater and in some embodiments in aspect ratios of about 8 or greater.

Although the illustrated oxide material deposition cycle begins with contacting the surface of the substrate with the first vapor phase precursor, in other embodiments the deposition cycle begins with contacting the surface of the substrate with the second vapor phase precursor comprising molecular oxygen. It will be understood by the skilled artisan that contacting the substrate surface with the first vapor phase precursor and second vapor phase precursor comprising molecular oxygen are interchangeable in the deposition cycle. Additionally, some cycles can include multiple sequential repetitions of the same phase.

In some embodiments the substrate is moved such that different reactants alternately and sequentially contact the surface of the substrate in a desired sequence for a desired time. In some embodiments the removing blocks, 130 and 150 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber. In some embodiments the substrate is exposed to first and second precursors in the same reaction chamber.

The skilled artisan can determine the optimal reactant evaporation temperatures based on the properties of the selected precursors. The skilled artisan can determine the optimal reactant contact times through routine experimentation based on the properties of the selected precursors and the desired properties of the deposited oxide material.

The growth rate of the deposited oxide material will vary depending on the reaction conditions. As described below, in initial experiments, the growth rate varied between about 0.01 and about 1.5 Å/cycle. In some embodiments the growth rate may be from about 0.01 Å/cycle to about 10.0 Å/cycle, from about 0.1 Å/cycle to about 2.5 Å/cycle, or from 0.3 Å/cycle to about 1.5 Å/cycle. In some embodiments, if decomposition of the precursor occurs, the growth rate can be more than 2.5 Å/cycle or more than 5 Å/cycle.

In some embodiments the deposited oxide material comprises a thin film. In some embodiments the deposited oxide material comprises a metal oxide, and in some embodiments the deposited oxide material comprises an insulating metal oxide such as lanthanum oxide, hafnium oxide, zirconium oxide, magnesium oxide, a transition metal oxide, or aluminum oxide. In some embodiments the deposited oxide material is lanthanum oxide, hafnium oxide, zirconium oxide, magnesium oxide, a transition metal oxide, or aluminum oxide. As used herein, magnesium oxide refers to materials having the general chemical formula MgO or $MgO_x$, wherein x is from about 0.8 to about 1.2, but it will be understood that magnesium oxide need not be stoichiometric. As used herein, lanthanum oxide refers to materials having the general chemical formula $La_2O_3$ or $LaO_x$, but it will be understood that lanthanum oxide need not be stoichiometric. As used herein, hafnium oxide refers to materials having the general formula $HfO_2$ or $HfO_x$, but it will be understood that hafnium oxide need not be stoichiometric. As used herein, zirconium oxide refers to materials having the general formula $ZrO_2$ or $ZrO_x$, but it will be understood that zirconium oxide need not be stoichiometric. As used herein, aluminum oxide refers to materials having the general formula $Al_2O_3$ or $AlO_x$, but it will be understood that aluminum oxide need not be stoichiometric.

In some embodiments, metal oxide materials comprise other constituents (e.g., metal silicates or metal oxynitrides). In some embodiments, metal oxide materials are formed that consist essentially of a metal or metals and oxygen. In some embodiments, contaminants other than metal or metals and oxygen represent no more than about 30 at %, no more than about 20 at %, no more than about 10 at %, no more than about 5 at %, no more than about 3 at %, no more than about 1.5 at %, or no more than about 0.5 at % of the thin film when excluding hydrogen. In some embodiments contaminants other than metal or metals and oxygen represent no more than about 45%, no more than about 30 at %, no more than about 20 at %, no more than about 10 at %, no more than about 5 at %, no more than about 3 at %, no more than about 1.5 at %, or no more than about 0.5 at % when including hydrogen. In some embodiments an additional phase, such as an additional metal phase may be provided after the final deposition cycle, or intermittently in the deposition process.

In some embodiments an oxide material is selectively deposited on a substrate by a cyclical vapor deposition process comprising one or more cycles, each cycle comprising:

contacting the substrate with a first vapor phase precursor;

exposing the substrate to a purge gas or vacuum after contacting the substrate with the first vapor phase precursor;

supplying molecular oxygen ($O_2$) to the substrate surface in order to contact the substrate with a second vapor phase precursor comprising molecular oxygen ($O_2$);

exposing the substrate to a purge gas or vacuum after contacting the substrate with molecular oxygen;

optionally repeating the contacting and exposing steps until an oxide material of the desired thickness has been formed on the substrate.

Figure 2:
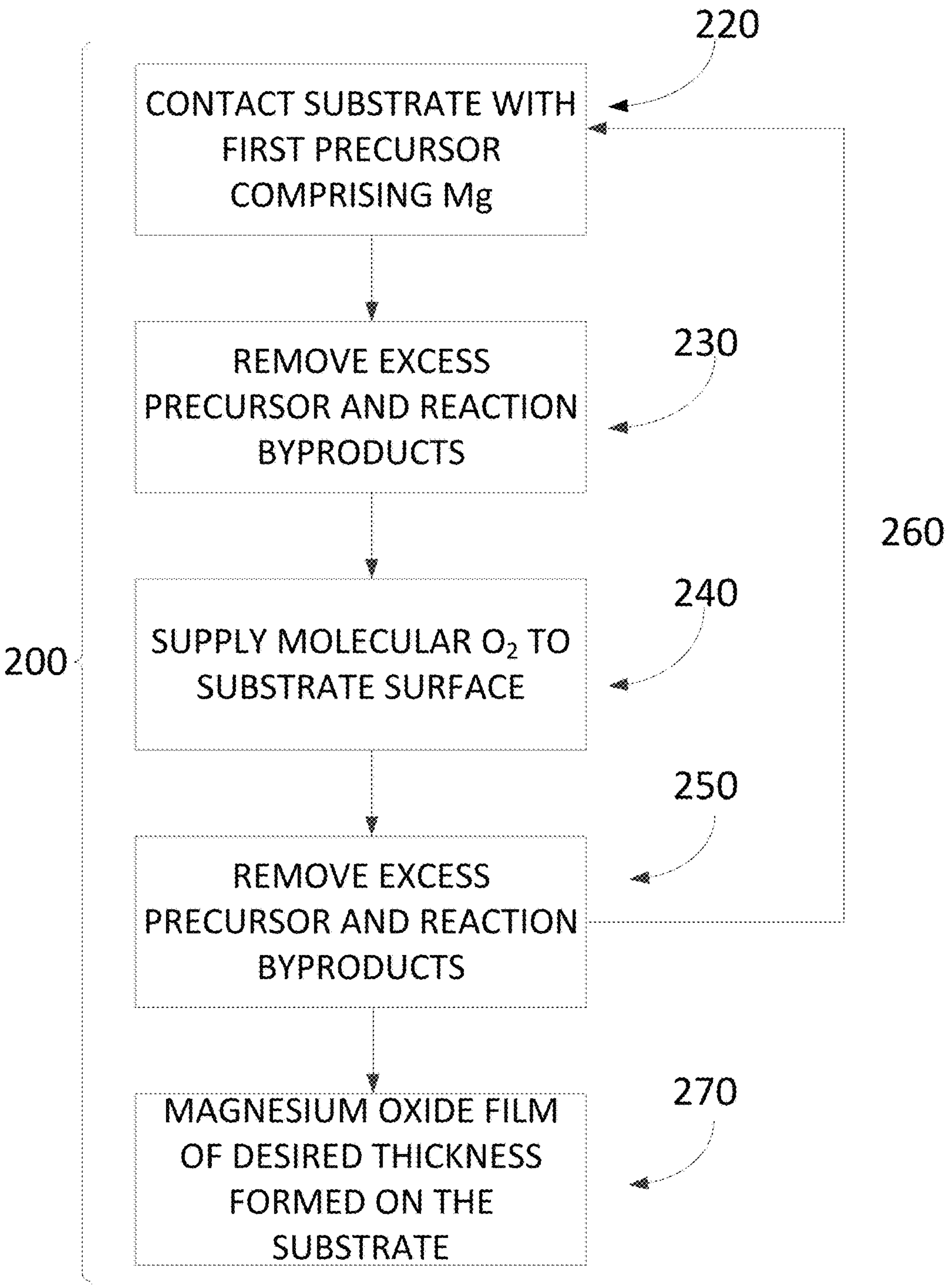
FIG. 2 is a process flow diagram generally illustrating processes for depositing a magnesium oxide film.

Referring now to FIG. 2 and according to some embodiments a magnesium oxide material, for example a magnesium oxide thin film is deposited on a surface of a substrate by a cyclical deposition process 200 comprising at least one cycle comprising:

contacting the substrate with a first vapor phase precursor comprising magnesium at block 220;

removing any excess first vapor phase precursor comprising magnesium and/or reaction by products, if any, from the surface at block 230;

supplying molecular oxygen ($O_2$) to the substrate surface in order to contact the substrate with a second vapor phase precursor comprising molecular oxygen at block 240;

removing from the surface any excess second precursor comprising molecular oxygen and/or any gaseous by-products at block 250, and optionally repeating at block 260 the contacting and removing blocks until a magnesium oxide thin film of the desired thickness has been formed at block 270 on a surface of the substrate.

In some embodiments the above described cyclical deposition may be an ALD type process. In some embodiments, the deposition may selectively form the magnesium oxide material on a first surface relative to a second surface. In one embodiment the first and second surfaces are on the same substrate. In another embodiment the first surface is on a substrate and the second surface is on another part, such as a reactor surface.

Although the illustrated magnesium oxide deposition cycle begins with contacting the substrate with the first precursor comprising magnesium, in other embodiments the deposition cycle begins with contacting the substrate with the second precursor comprising molecular oxygen. It will be understood by the skilled artisan that contacting the substrate surface with first precursor comprising magnesium and second precursor comprising molecular oxygen are interchangeable in the deposition cycle.

In some embodiments the above describe deposition process may be a selective deposition process. That is, in some embodiments a substrate comprising a first surface and a second, different surface is provided and magnesium oxide is selectively deposited on the first surface of the substrate relative to the second, different surface by a cyclical deposition process comprising at least one cycle comprising alternately and sequentially contacting the substrate with a vapor phase first precursor comprising magnesium and a vapor phase second precursor comprising molecular oxygen.

In some embodiments the first precursor may comprise an organometallic compound comprising magnesium and the second precursor may comprise $O_2$. In some embodiments the first precursor may comprise $Mg(Cp)_2$ and the second precursor may comprise $O_2$.

In some embodiments a magnesium oxide film may be deposited with a growth rate from about 0.01 Å/cycle to about 2.0 Å/cycle. In some embodiments the growth rate of a magnesium oxide thin film may be greater than about 0.1 Å/cycle, greater than about 0.5 Å/cycle, greater than about 0.75 Å/cycle, or greater than about 1.0 Å/cycle.

In some embodiments a standard deviation (STD) uniformity of a deposited magnesium oxide thin film may be less than about 10%, less than about 7.5%, less than about 5%, or even less than about 1%. In some embodiments a deposited magnesium oxide thin film may have a step coverage greater than about 50%, greater than about 80%, greater than about 90%, greater than about 95%, greater than about 98%, greater than about 99% or greater. These values can be achieved in features with aspect ratios of 2 or greater, in some embodiments in aspect ratios of about 3 or greater, in some embodiments in aspect ratios of about 5 or greater and in some embodiments in aspect ratios of about 8 or greater.

In some embodiments the deposition temperature for a magnesium oxide selective deposition process may be about 150° C. to about 500° C., about 200° C. to about 450° C., or about 225° C. to about 400° C. In some embodiments the pressure in the reaction chamber may be from about 0.001 Torr to about 100 Torr, or from about 0.1 Torr to about 20 Torr.

Figure 3:
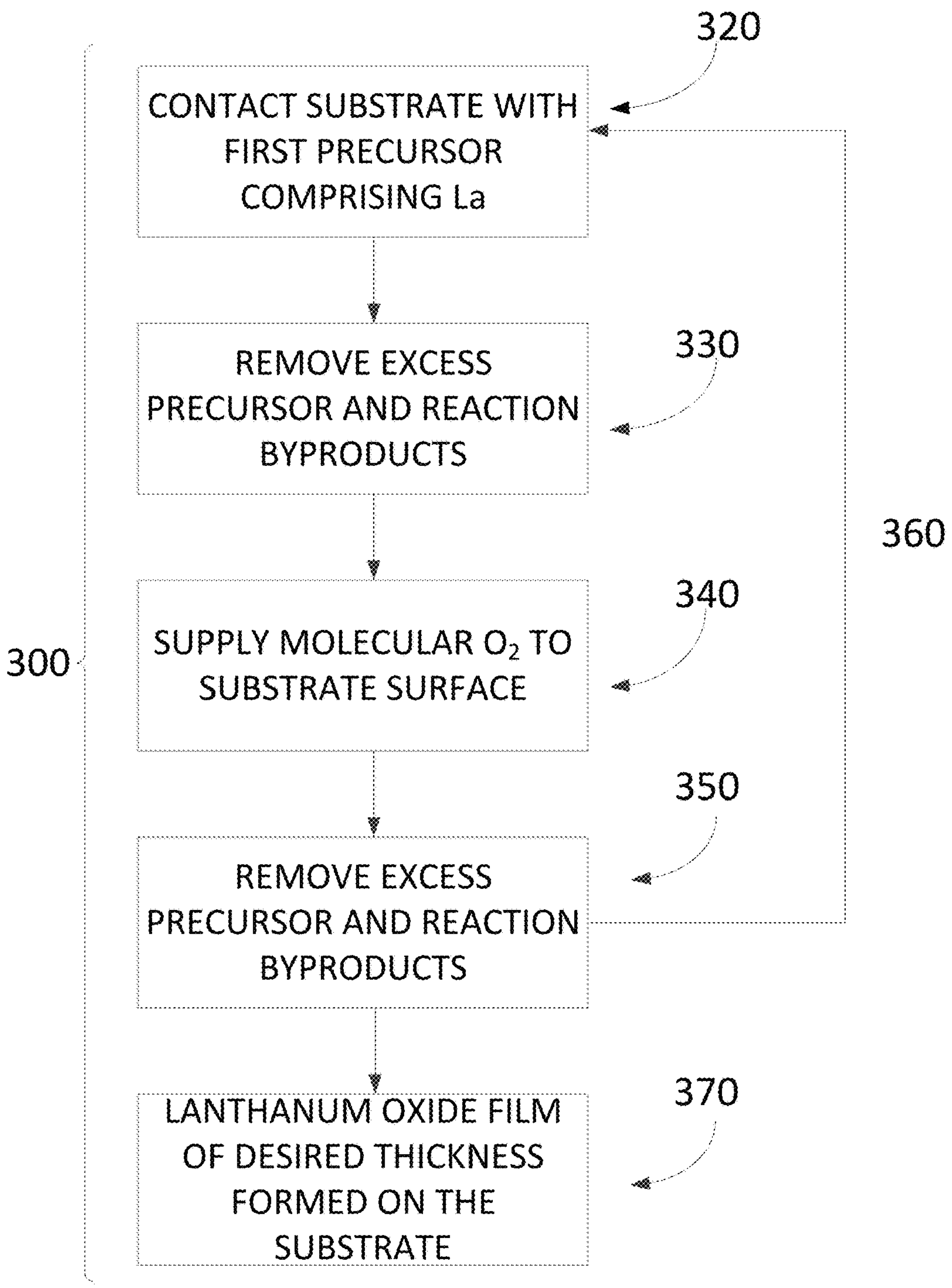
FIG. 3 is a process flow diagram generally illustrating processes for depositing a lanthanum oxide film.

Referring now to FIG. 3 and according to some embodiments lanthanum oxide material, for example a lanthanum oxide thin film is selectively deposited on a substrate by an ALD type deposition process 300 comprising at least one cycle comprising:

contacting the substrate with a first vapor phase precursor comprising lanthanum at block 320;

removing any excess first precursor and reaction by products, if any, from the substrate at block 330;

supplying molecular oxygen ($O_2$) to the substrate surface in order to contact the substrate with a second vapor phase precursor comprising molecular oxygen at block 340;

removing from the substrate, at block 350, any excess second precursor comprising molecular oxygen and any gaseous by-products, and optionally repeating at block 360 the contacting and removing blocks until an oxide material of the desired thickness has been formed at block 370 on the first surface of the substrate.

In some embodiments the above described cyclical deposition may be an ALD type process. In some embodiments, the deposition may selectively form the lanthanum oxide material on a first surface relative to a second surface. In one embodiment the first and second surfaces are on the same substrate. In another embodiment the first surface is on a substrate and the second surface is on another part, such as a reactor surface.

Although the illustrated lanthanum oxide deposition cycle begins with contacting the substrate with the first precursor comprising lanthanum, in other embodiments the deposition cycle begins with contacting the substrate with the second precursor comprising molecular oxygen. It will be understood by the skilled artisan that contacting the substrate surface with first precursor comprising lanthanum and second precursor comprising molecular oxygen are interchangeable in the deposition cycle.

In some embodiments the first precursor may comprise an organometallic compound comprising lanthanum and the second precursor may comprise $O_2$. In some embodiments the first precursor may comprise lanthanum formamidinate ($La(FAMD)_3$) and the second precursor may comprise $O_2$.

Figure 4:
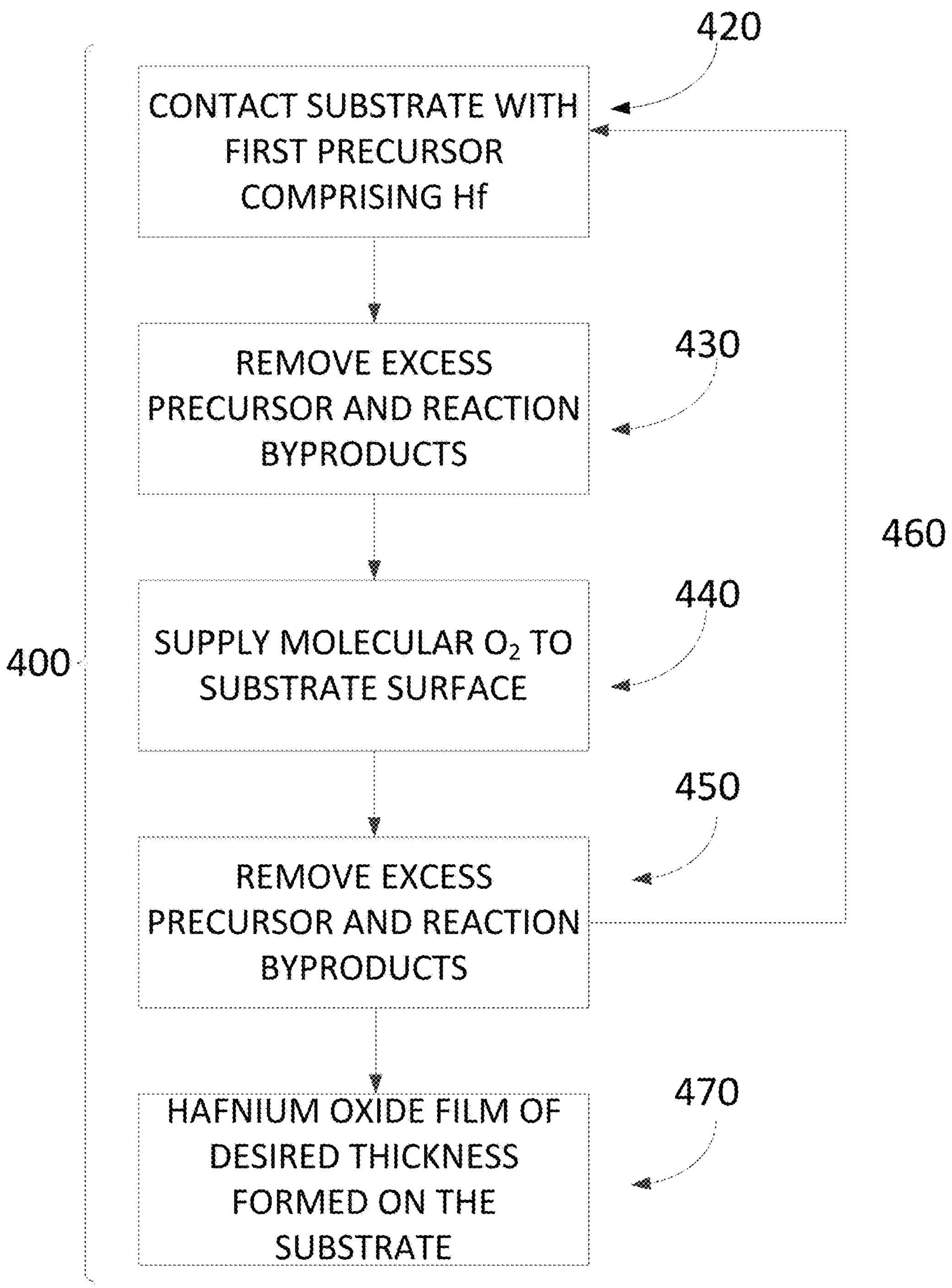
FIG. 4 is a process flow diagram generally illustrating processes for depositing a hafnium oxide film.

Referring now to FIG. 4 and according to some embodiments hafnium oxide material, for example a hafnium oxide thin film is selectively deposited on a substrate by an ALD type deposition process 400 comprising at least one cycle comprising:

contacting the substrate with a first vapor phase precursor comprising hafnium at block 420;

removing any excess first precursor and reaction by products, if any, from the substrate at block 430;

supplying molecular oxygen ($O_2$) to the substrate surface in order to contact the substrate with a second vapor phase precursor comprising molecular oxygen at block 440;

removing from the substrate, at block 450, any excess second precursor comprising molecular oxygen and any gaseous by-products, and optionally repeating at block 460 the contacting and removing blocks until an oxide material of the desired thickness has been formed at block 470 on the first surface of the substrate.

In some embodiments the above described cyclical deposition may be an ALD type process. In some embodiments, the deposition may selectively form the hafnium oxide material on a first surface relative to a second surface. In one embodiment the first and second surfaces are on the same substrate. In another embodiment the first surface is on a substrate and the second surface is on another part, such as a reactor surface.

Although the illustrated hafnium oxide deposition cycle begins with contacting the substrate with the first precursor comprising hafnium, in other embodiments the deposition cycle begins with contacting the substrate with the second precursor comprising molecular oxygen. It will be understood by the skilled artisan that contacting the substrate surface with first precursor comprising hafnium and second precursor comprising molecular oxygen are interchangeable in the deposition cycle.

In some embodiments the first precursor may comprise an organometallic compound comprising hafnium and the second precursor may comprise $O_2$. In some embodiments the first precursor may comprise tetramethylethyl alkylamide Hafnium (TEMAH) and the second precursor may comprise $O_2$.

Figure 5A:
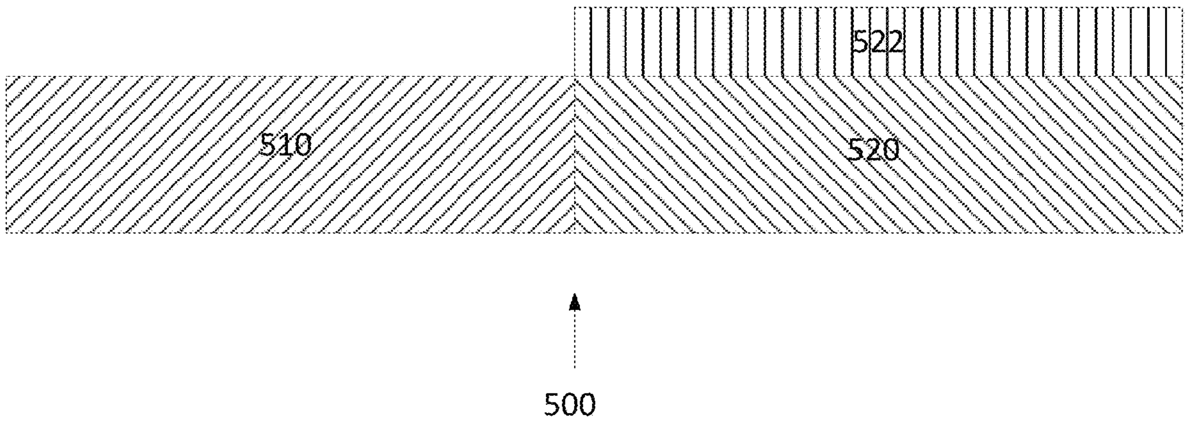
FIG. 5A is a schematic diagram generally illustrating a substrate comprising a first surface, a second surface, and a passivation layer.

FIG. 5A is a schematic diagram generally illustrating a substrate 500 comprising a first surface 510 and a second, different surface 520 prior to being subjected to a selective deposition process. In some embodiments a deposition process as described herein can be used to selectively deposit an oxide material on the first surface 510 of the substrate 500 relative to the second surface 520. In some embodiments the second surface 520 of the substrate may comprise an organic passivation layer 522 as described herein, for example a polymer passivation layer or a SAM.

Figure 5B:
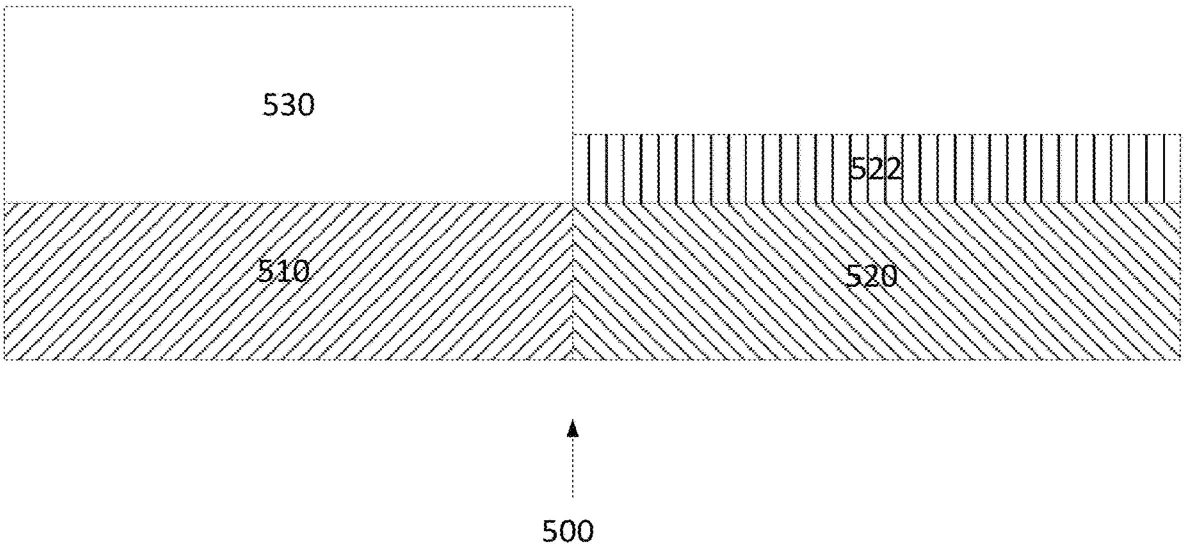
FIG. 5B is a schematic diagram generally illustrating a substrate comprising a first surface, a second surface, and a passivation layer after being subjected to a selective deposition process.

FIG. 5B is a schematic diagram generally illustrating a substrate 500 comprising a first surface 510 and a second, different surface 520 after being subjected to a selective deposition process as described herein. An oxide material 530 of a desired thickness has been selectively deposited on the first surface 510 of the substrate relative to the second surface 520 comprising a passivation layer 522. Thus, in some embodiments the organic passivation layer 522 may inhibit or prevent deposition of the oxide material 530 over the second surface 520. Further, in some embodiments the selective deposition process can achieve deposition of an oxide material 530 on the first surface 510 without degrading or oxidizing the organic passivation layer 522 enough to expose the underlying second surface 520.

It should be noted that FIGS. 5A and 5B are schematic diagrams and the thickness of the layers depicted therein do not necessarily correspond to the actual thicknesses or sizes of the layers in some embodiments. Further, although no oxide material is illustrated as having been deposited over second surface 520 or passivation layer 522, in some embodiments some oxide material 530 may be deposited over the second surface 520, to a lesser thickness than over the first surface 510 due to selectivity in the deposition. In some embodiments when the second surface 520 comprises a passivation layer 522 to minimize deposition thereover, removal of the passivation layer 522 can undercut and remove any of the deposited oxide material 530 thereover. However, in some embodiments, deposition of oxide material 530 only occurs on the first surface 510 and does not occur over the second surface 520.

Figure 6:
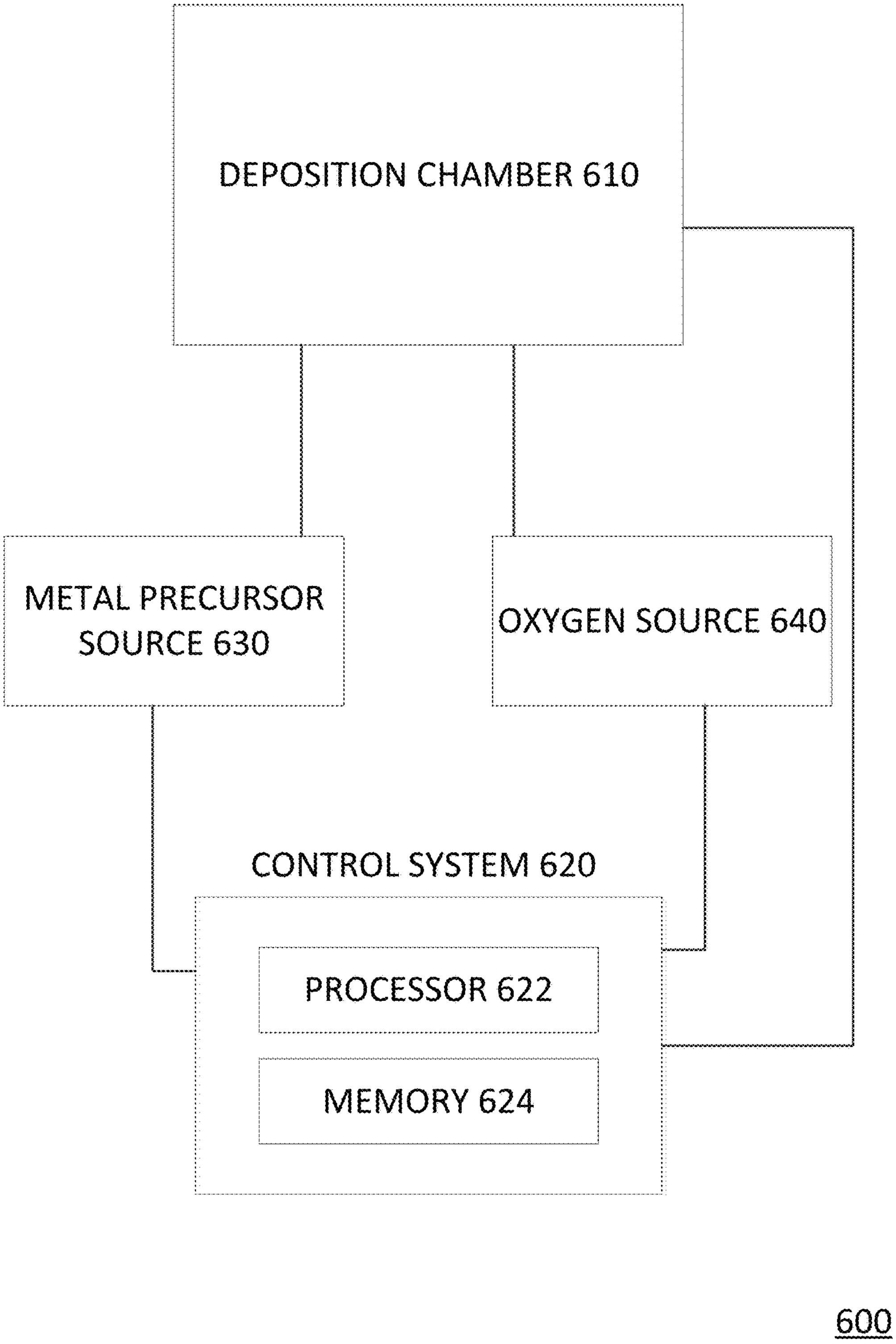
FIG. 6 is a schematic diagram generally illustrating a reactor configured to perform the processes described herein.

With reference to FIG. 6, in some embodiments the above-described deposition processes may be carried out in a reactor 600 comprising a deposition chamber or reaction space 610. In order to conduct the processes described above, in some embodiments the reactor 600 includes a control system 620. The control system 620 can be configured to control the supply of the first metal precursor to the deposition chamber 610 via a first metal precursor source 630 connected to the deposition chamber 610. The control system 620 can also be configured to control the supply of second reactant to the deposition chamber 610 via an oxygen source 640 connected to the deposition chamber 610. Thus the control system 620 can provide the desired alternating and/or sequential contacting steps, for example via pulses of the precursors from the metal precursor source 630 and/or oxygen source 640, as described above with respect to FIGS. 1-4. The control system 620 can comprise a processor 622 and a memory 624. In some embodiments the control system 620 can include a software program stored in the memory and configured to conduct the process. It can also include other components known in the industry. A general purpose computer can be programmed for use as the control system 620. The control system 620 can automatically provide the first metal precursor and/or second reactant to the deposition chamber 610, for example by opening or closing a valve of the first metal precursor source 630 and/or oxygen source 640 according to the program stored in the memory. The control system 620 can be configured to control other operations of the reactor 600, such as temperature, pressure and robotics control, among other operational parameters.

An operating procedure for the reactor 600 will now be described using the example of time divided ALD for a stationary substrate, though the skilled artisan will readily appreciate how to adopt the teachings herein for space divided ALD or hybrid systems. In a first stage, the first metal precursor is supplied to the deposition chamber 610. Specifically, the first metal precursor source 630 is accessed such that the first metal precursor can flow through, for example, a first supply conduit into the deposition chamber 610 while the oxygen source 640 does not flow to the deposition chamber 610. The second reactant flow can be prevented from flowing to the deposition chamber 610, for example, a pulsing valve or by an arrangement of inert gas valving, such as, the arrangement described at page 8 of International Publication No. WO 02/08488, published Jan. 21, 2002, the disclosure of which is hereby incorporated in its entirety by reference herein. In some embodiments the purging gas flows through both the first supply conduit connecting the first metal precursor source 630 to the deposition chamber 610 and the second supply conduit connecting the oxygen source 640 to the deposition chamber 610. During this stage, the first metal precursor can be adsorbed on active sites of the substrate to form an adsorbed monolayer as described herein. During a second stage, any excess first metal precursor and any gaseous by-products are removed from the deposition chamber 610, or at least from the vicinity of the substrate surface. In some embodiments this can be accomplished by shutting off the first metal precursor flow while continuing the flow of a purge gas through the supply conduits. In some embodiments, purge gas can additionally or instead be supplied through a third supply conduit that is independently connected to the deposition chamber 610. In a third stage, the second reactant is supplied to the deposition chamber 610. Specifically, while the first metal precursor source 630 does not flow to the deposition chamber 610, the oxygen source 640 is accessed to flow to the deposition chamber 610. In some embodiments purging gas is still supplied through both the first and second conduits. The first metal precursor and second reactant are mutually reactive. As such, the adsorbed species (typically a monolayer or less for pure ALD) of the first metal precursor reacts with the second reactant that has been introduced into the deposition chamber 610. This reaction leaves the desired metal oxide thin film on the substrate. The reaction is generally self-limiting and terminates once the entire amount of the adsorbed species of the first metal precursor has been consumed. It should be noted that the reaction may leave an element in the thin layer or may simply strip ligands from the adsorbed layer. In a fourth stage, any excess second reactant and any gaseous by-product is removed from the deposition chamber 610, or at least from the vicinity of the substrate surface. This can be accomplished by shutting off the oxygen source while the purging gas flows to both the first and second supply conduits remain on. The cycle described above can be repeated as necessary to deposit the metal oxide thin film to a desired thickness. Of course, in some embodiments, purge phases can be replaced with pump down phases or with phases that include moving the substrate to a separate deposition chamber or area of the deposition chamber that does not include a given reactant.

First Precursors

A number of different first precursors can be used in the selective deposition processes described herein. In some embodiments the first precursor may comprise a metal. In some embodiments the first precursor may comprise at least one alkyl ligand, such as a $C_1$-$C_4$ alkyl ligand. In some embodiments the first precursor may comprise an organometallic or metalorganic compound. In some embodiments the first precursor may comprise at least one cyclopentadienyl (Cp) ligand. In some embodiments the first precursor may comprise a formamidinate or a amidinate compound. In some embodiments the first precursor may comprise a beta-diketonate compound. In some embodiments the first precursor may comprise an alkylamino compound, such as a dialkylamino compound. In some embodiments the first precursor may comprise an alkylamino ligand, such as $—NMe_2$, $—NEt_2$ or —NEtMe.

In some embodiments the first precursor may comprise magnesium. In some embodiments the first precursor may be an organometallic or an metalorganic compound comprising magnesium. For example, in some embodiments the first precursor may comprise $Mg(Cp)_2$ or a derivative thereof.

In some embodiments the first precursor may comprise lanthanum. In some embodiments the first precursor may be an organometallic compound comprising lanthanum. In some embodiments the first precursor may comprise lanthanum formamidinate ($La(FAMD)_3$).

In some embodiments the first precursor may comprise hafnium. In some embodiments the first precursor may comprise an organometallic compound comprising hafnium. For example, in some embodiments the first precursor may comprise alkylamino hafnium compound, such as tetramethylethyl alkylamino Hafnium (TEMAH, $Hf(NEtMe)_4$) or a derivative thereof.

In some embodiments the first precursor may comprise zirconium. In some embodiments the first precursor may comprise aluminum. In some embodiments the first precursor comprises a transition metal. In some embodiments the first precursor does not comprise a noble metal, such as Ru.

In some embodiments, the first precursor has the following formula:

$$MgL_2 \qquad (I)$$

wherein Mg is magnesium, and wherein each L can be independently selected to be a hydrocarbon group. In some embodiments each L can be linear, branched, cyclic alkyl or unsaturated hydrocarbon group, such as alkenyl, alkynyl, aromatic, cyclopentadienyl, phenyl, cyclooctadienyl, or cycloheptatrienyl group. In some embodiments one or both L can be a cyclopentadienyl group. In some embodiments, one or both L can be a bidentate ligand, such as betadiketonate, guanidinate or amidinate. In some embodiments, the betadiketonate ligand can be acetylacetonate or 2,2,6,6-tetramethyl-3,5-heptanedionato (thd).

In some embodiments, the first precursor is a cyclopentadienyl compound or derivate thereof, such as alkylsubstituted cyclopentadienyl compound and have the following formula:

$$Mg(R_1R_2R_3R_4R_5Cp)_2 \qquad (II)$$

wherein each of the $R_1$ groups, each of the $R_2$ groups, each of the $R_3$ groups, each of the $R_4$ groups, and each of the $R_5$ groups can be independently selected to be hydrogen or a substituted or unsubstituted alkyl group. In some embodiments each of the $R_1$ groups, each of the $R_2$ groups, each of the $R_3$ groups, each of the $R_4$ groups, and each of the $R_5$ groups can be independently selected to be hydrogen or a linear or branched $C_1$-$C_5$ alkyl group. In some embodiments each of the $R_1$ groups, each of the $R_2$ groups, each of the $R_3$ groups, each of the $R_4$ groups, and each of the $R_5$ groups can be independently selected to be hydrogen or a $C_1$-$C_3$ alkyl group, such as methyl, ethyl, n-propyl or i-propyl group. In some embodiments the first precursor is $Mg(Cp)_2$.

In some embodiments, the first precursor comprises one or more ligands, such as cyclopentadienyl ("Cp") ligands. These first precursor compounds can be selected from a group consisting of the following compounds:

$$(Cp)_xLa \qquad (III);$$

$$(Cp)_xL_yLa \qquad (IV);$$

$$(Cp)_xW_nLa \qquad (V);$$

$$(CP)_xL_yW_nLa \qquad (VI);$$

La is lanthanum, Cp is a cyclopentadienyl or a cyclooctadienyl group, so that Cp groups in chemical formulas I-IV can be the same as each other or different from one other; x denotes the number of the Cp ligands and it is an integer from 1 up to the oxidation state of La; it should be noted that cyclooctadiene is usually shortened as Cod, but here the presentation is simplified by the use of the single common abbreviation Cp for both cyclopentadienyl and cyclooctadienyl;

$L_y$ is a neutral adduct ligand that bounds from one or more of its atoms to the metal and wherein y denotes the number of the bound ligands; and W is some other ligand with a valence of one less than Cp and where n denotes the number of ligands. In some embodiments W is amidinate or formamidinate. In some embodiments W is a beta-diketonate or its corresponding sulfur or nitrogen compound, halide, amide, alkoxide, carboxylate or Schiff's base.

In the chemical equations I-IV, the cyclopentadienyl and/or cyclooctadienyl groups can be in the same molecule, so that there is a bridge between two Cp-groups consisting of a substituted or unsubstituted $C_1$-$C_6$ chain that may contain a heteroatom selected from Si, N, P, Se, S or B.

In some embodiments L is an independently selected:

(i) a hydrocarbon, (ii) a hydrocarbon that contains oxygen, (iii) a hydrocarbon that contains nitrogen, (iv) a hydrocarbon that contains sulfur, (v) a hydrocarbon that contains phosphor, (vi) a hydrocarbon that contains arsenic, (vii) a hydrocarbon that contains selenium and/or (viii) a hydrocarbon that contains tellurium In some embodiments L is and independently selected:

(a) amine or polyamine, (b) bipyridine, (c) a ligand according to a chemical diagram:

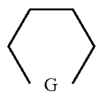

wherein G is —O—, —S—, or —$NR^1$, where $R^1$ is an independently selected hydrogen or substituted or unsubstituted, cyclic, linear or branched, alkyl, alkenyl, aryl, alkylaryl, arylalkyl, alkoxy, thio, cyano or silyl group. A cyclic or aromatic ring in $R^1$ may contain a heteroatom. Hydrogen or a $R^1$-type substituent may also be attached to the carbon atoms in chemical equation V, or (d) ether or thioether.

Cyclopentadienyl or cyclooctadienyl groups, Cp in chemical formulas I-IV have the form:

$$Cp'R_mH_{a-m} \qquad (VII)$$

wherein m is an integer from 0-8, when a is 8 and m is an integer 0-5 when a is 5, Cp' is fusioned or isolated cyclopentadienyl or cyclooctadienyl, and R is an independently selected hydrocarbon fragment containing 1-6 carbon atoms, such as a $C_1$-$C_6$ hydrocarbon.

In some embodiments each R ligand can be the same as each other R ligand, or each R ligand may different from one another. That is, each R ligand can be independently selected. In some embodiments R can be a substituted or unsubstituted, cyclic, linear or branched, alkyl alkenyl, aryl, alkylaryl, arylalkyl, alkoxy, thio, amino, cyano or silyl group. The cyclic or aromatic ring of the substituent may contain a heteroatom. Examples of the substituents are methyl, ethyl, propyl and isopropyl groups.

Neutral adduct ligands L shown in chemical equations II and IV can be independently selected ethers, amines or solvent molecules such as tetrahydrofurane that form a bond to the metal with one atom. Examples of suitable neutral adduct ligands that form a bond to a metal with several atoms are polyethers and polyamines.

In some embodiments a first precursor may comprise at least one cyclopentadienyl ligand and can be written according to Formula VIII:

$$(R^1R^2R^3R^4R^5Cp)_x\text{-}MR^0_z\text{—}(R^6)_y \qquad (VIII)$$

wherein M is a metal selected from the group consisting of Mg, Sr, Ba, Sc, Y and lanthanides;

wherein each of the $R_0$ groups, each of the $R_1$ groups, each of the $R_2$ groups, each of the $R_3$ groups, each of the $R_4$ groups, and each of the $R_5$ groups can be independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups;

wherein $R^6$ is independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups;

iv. heterocyclic groups; and v. $NR^1R^2$; and wherein both x and y are ≥1 and z≥0.

In some embodiments, the first precursor comprising a cyclopentadienyl compound comprises at least one ligand that is bonded to a metal via nitrogen as depicted by Formula IX:

$$(R^1R^2R^3R^4R^5Cp)_x\text{-}MR^0_z\text{—}(NR^1R^2)_y \qquad (IX)$$

wherein M is a metal selected from the group consisting of Mg, Sr, Ba, Sc, Y or lanthanides;

wherein each of the $R_0$ groups, each of the $R_1$ groups, each of the $R_2$ groups, each of the $R_3$ groups, each of the $R_4$ groups, and each of the $R_5$ groups is independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups; and wherein both x and y are ≥1 and z≥0.

In Formula IX, the alkyl, alkenyl and alkynyl groups can be selected from any linear or branched alkyl, alkenyl and alkynyl groups which have 1 to 6 carbon atoms. Examples of such alkyl groups include methyl; ethyl; n- and i-propyl-; n-, i- and t-butyl-; n- and isoamyl; n- and isopentyl; n- and isohexyl; and 2,3-dimethyl-2-butyl. In some embodiments, alkyl groups are used. In other embodiments the $C_{1-6}$, alkenyl and alkynyl groups include the corresponding groups having a corresponding degree of unsaturation can be used.

In some embodiments the first precursor is a compound having at least one cyclopentadienyl ligand and at least one chelating ligand, for example, a bidentate ligand. In some embodiments, this compound is depicted by Formula X, $(R^1R^2R^3R^4R^5Cp)_x\text{-}MR^0_z\text{—}(NR^1NR^2R)_y$, as follows:

(X)

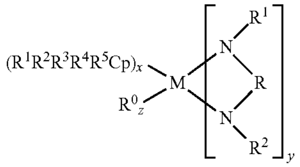

wherein M is a metal selected from the group consisting of Mg, Sr, Ba, Sc, Y or lanthanides;

wherein R can be any linear and branched $C_1$-$C_6$ alkyl, alkenyl or alkynyl groups, which are independently substituted or unsubstituted and R can be bonded to two bridging nitrogen atoms any point of alkyl, alkenyl and alkynyl groups;

wherein each of the $R^0$ groups, each of the $R^1$ groups, each of the $R^2$ groups, each of the $R^3$ groups, each of the $R^4$ groups, and each of the $R^5$ groups can be independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups; and wherein both x and y are ≥1 and z≥0.

In some other embodiments, the first precursor can be depicted by Formula XI, $(R^1R^2R^3R^4R^5Cp)_x$-$MR^0_z$—$[(NR^1NR^2)CNR^3]_y$, as follows:

(XI)

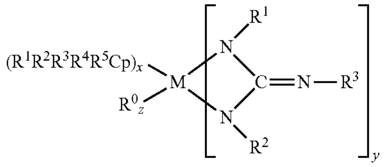

wherein M is a metal, selected from the group consisting of Mg, Sr, Ba, Sc, Y or lanthanides;

wherein each of the $R^0$ groups, each of the $R^1$ groups, each of the $R^2$ groups, each of the $R^3$ groups, each of the $R^4$ groups, and each of the $R^5$ groups can be independently selected from i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups; and wherein both x and y are ≥1 and z≥0.

In further embodiments, the first precursor is depicted by Formula XII, $(R^1R^2R^3R^4R^5Cp)_x$-$MR^0_z$—$[(NR^1NR^2)CNR^3R^4]_y$, as follows:

(XII)

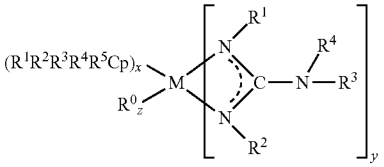

wherein M is a metal, selected from the group consisting of Mg, Sr, Ba, Sc, Y or lanthanides;

wherein each of the $R^0$ groups, each of the $R^1$ groups, each of the $R^2$ groups, each of the $R^3$ groups, each of the $R^4$ groups, and each of the $R^5$ groups can be independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups; and wherein both x and y are ≥1 and z≥0.

In some embodiments, the first precursor as described in Formulae VIII-XII may comprise $R^0$, $R^1$, $R^2$, $R^3$, $R^4$, $R^5$, and $R^6$ wherein each of the $R^0$ groups, each of the $R^1$ groups, each of the $R^2$ groups, each of the $R^3$ groups, each of the $R^4$ groups, and each of the $R^5$ groups, and each of the $R^6$ groups can be independently selected from i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, and alkylaryl; and iv. heterocyclic groups Optionally, a first precursor as described may comprise modified cyclopentadienyl groups. In some embodiments, the modified cyclopentadienyl groups are selected from the group consisting of $Me_5Cp$, MeCp, EtCp, and $Me_3SiCp$. In further embodiments, the first precursor may comprise an anionic or dianionic guanidinate ligand such as a triisopropylguandinate ligand.

Second Precursors

In some embodiments the second precursor comprises oxygen and may be referred to herein as the oxygen precursor, oxygen reactant, oxygen-containing precursor, or oxygen-containing reactant. In some embodiments the second precursor comprises molecular oxygen ($O_2$). In some embodiments the second precursor does not comprise a compound comprising oxygen other than $O_2$. In some embodiments the second precursor does not comprise $O_3$ or $H_2O$. In some embodiments the second precursor does not comprise a plasma, for example an oxygen plasma. In some embodiments the second precursor is supplied with or mixed with inert gas such as $N_2$, He or Ar.

In some embodiments the second precursor comprises molecular oxygen and less than about 50%, 25%, 15%, 10%, 5%, 1%, or 0.1% of impurities other than inert gases.

In some embodiments wherein the second precursor is molecular oxygen, such a second precursor may advantageously allow for improved purging from the substrate surface as compared with $O_3$ or $H_2O$. In some embodiments improved purging may allow for faster cycle times and may also allow for improved retention or minimal damage to the second surface, for example a second surface comprising an organic passivation layer such as a SAM or polymer.

In some embodiments the second precursor does not substantially oxidize or degrade the second surface of the substrate. For example, in some embodiments molecular oxygen does not oxidize or degrade a second surface comprising an organic passivation layer such as a SAM or polymer layer under the deposition conditions. That is, in some embodiments the selective deposition process may have a deposition temperature lower than the temperature at which an organic passivation layer may degrade or burn. In some embodiments the deposition temperature may be less than about 450° C., less than about 400° C., less than about 350° C., less than about 300° C. or lower.

Example 1

Deposition of magnesium oxide (MgO) thin films by ALD type processes according to some embodiments was carried out on various substrates using bis(cyclopentadienyl)magnesium ($Mg(Cp)_2$) as a first precursor comprising magnesium and molecular oxygen ($O_2$) as a second precursor. The deposition temperature was about 250° C. and the number of deposition cycles was varied for each sample.

Figure 7:
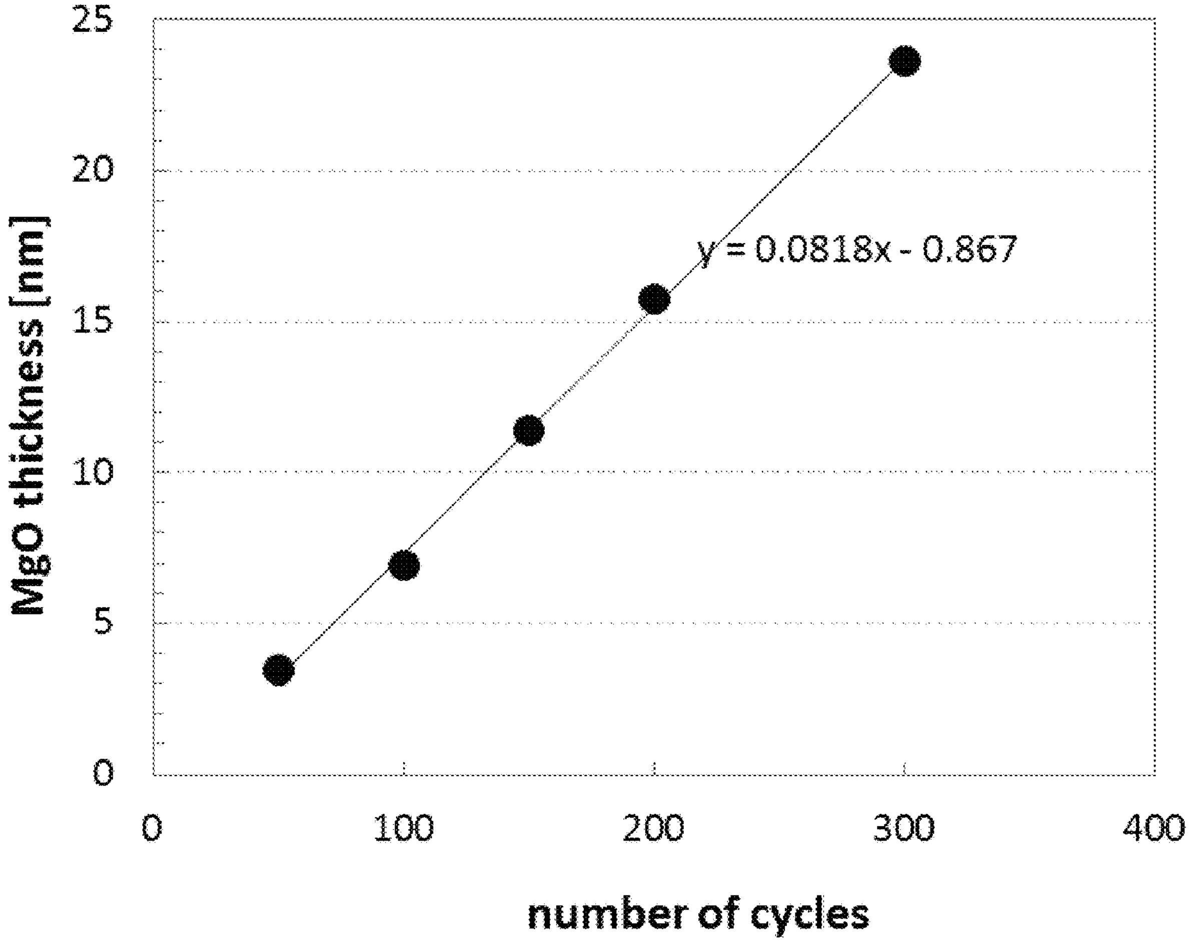
FIG. 7 is a plot showing magnesium oxide film thickness as a function of number of deposition cycles for magnesium oxide films deposited according to some embodiments.

Referring now to FIG. 7, it was observed that the deposited magnesium oxide film thickness increased linearly with an increasing number of deposition cycles. The growth rate of the magnesium oxide deposition process was observed to be about 0.77 nm/cycle and deposition was observed to be highly uniform.

Example 2

Deposition of magnesium oxide (MgO) was carried out on two coupon substrates, a reference silicon coupon substrate having a native silicon oxide surface, and two SAM silicon coupon substrates, each having a surface comprising a SAM layer formed over a portion of the native silicon oxide surface.

The water contact angle for the surfaces of the coupon substrates was measured before and after deposition of an MgO layer. The water contact angle of a surface indicates the hydrophobic or hydrophilic nature of that surface. This water contact angle measurement was used to study the passivation capability of the SAM layer on the SAM coupon substrates.

Figure 8A:
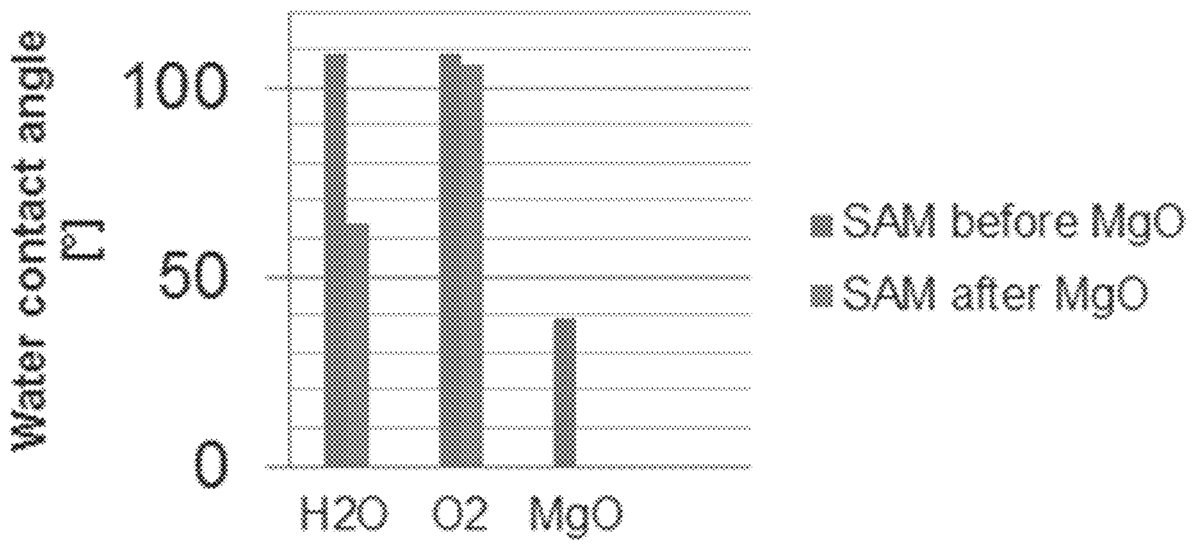
FIG. 8A is a bar graph comparing the water contact angle of a self-assembled monolayer (SAM) before and after being subjected to various deposition processes.

As depicted in FIG. 8A, the contact angle for the SAM layer was very high, greater than 105°, prior to an MgO deposition process, which indicated that the SAM surface comprising —$CH_x$ terminations was highly hydrophobic. The native oxide surface was measured as having a very low contact angle, indicating the hydrophilic nature of the surface comprising Si—OH terminations.

The SAM coupon substrates were then subjected to MgO deposition processes. A first SAM coupon substrate was subjected to an MgO deposition process according to some embodiments and described herein, including $MgCp_2$ as a first precursor and $O_2$ as a second precursor. The second SAM coupon substrate was subjected to a typical MgO deposition process as known in the art, including $MgCp_2$ as a first precursor and $H_2O$ as a second precursor.

As depicted in FIG. 8A, the water contact angle of the SAM layer of the first SAM coupon substrate remained very high after the MgO deposition process including $O_2$ as a second precursor according to some embodiments. This is indicative of desirable passivation properties, of the SAM layer against an MgO deposition process including $O_2$ as a second precursor, thereby enabling the deposition process to be highly selective. The water contact angle of the SAM layer of the second SAM coupon was significantly lowered after being subjected to an MgO deposition process including $H_2O$ as a second precursor, indicating poor performance of the SAM as a passivation layer.

Figure 8B:
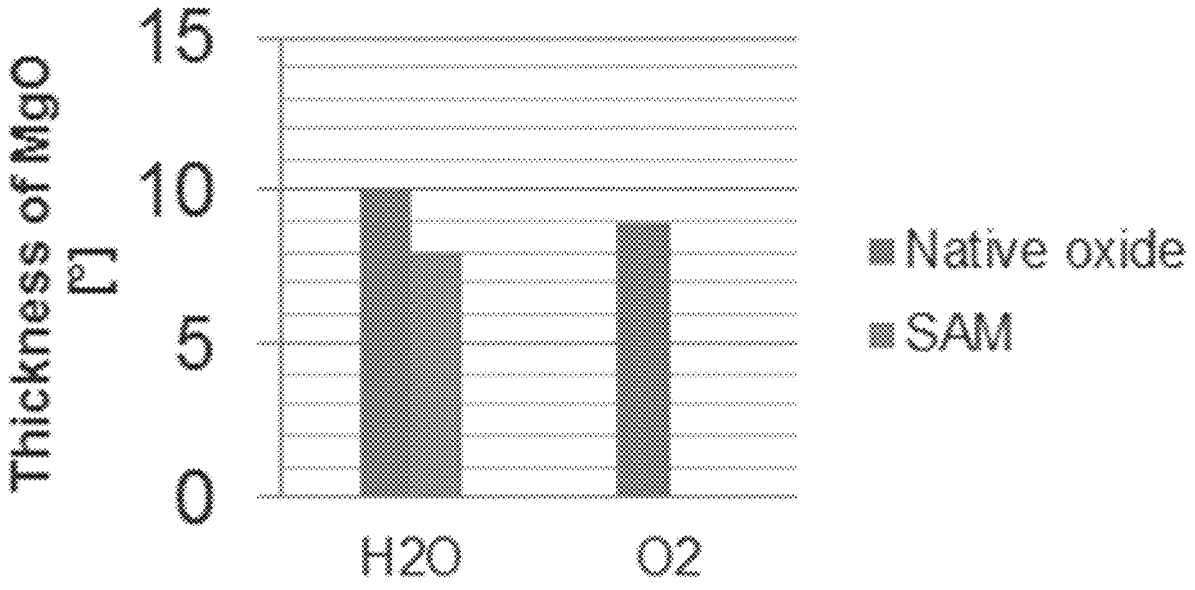
FIG. 8B is a bar graph comparing deposited MgO film thickness on a first native silicon oxide surface relative to a second surface comprising a SAM for a deposition process according to some embodiments including $O_2$ as a second precursor and a deposition process including $H_2O$ as a second precursor.

FIG. 8B compares the thicknesses of MgO deposited on the reference coupon substrate with the thickness of MgO deposited on the two SAM coupon substrates. The thickness of the deposited MgO layer was almost the same for the reference coupon substrate and the second SAM substrate subjected to the MgO deposition process including $H_2O$ as a second precursor, however no MgO layer was measured on the first SAM coupon substrate subjected to the MgO deposition process including $O_2$ as a second precursor according to some embodiments.

The first SAM coupon substrate was also analyzed with XPS, which detected a small amount of Mg on the first SAM coupon; however the amount of Mg detected did not significantly increase as a function of MgO deposition cycles including $O_2$ as a second precursor up to a nominal thickness of 25 nm.

Example 3

Deposition of hafnium oxide ($HfO_2$) was carried out on a first silicon coupon substrate having a native silicon oxide surface, and a second silicon coupon substrate having a surface comprising a SAM layer formed over a portion of the native silicon oxide surface. The coupon substrates were subjected to an ALD hafnium oxide deposition process including TEMAH as a first precursor and $O_2$ as a second precursor according to some embodiments and as described herein. The deposition temperature was 285°.

Figure 9A:
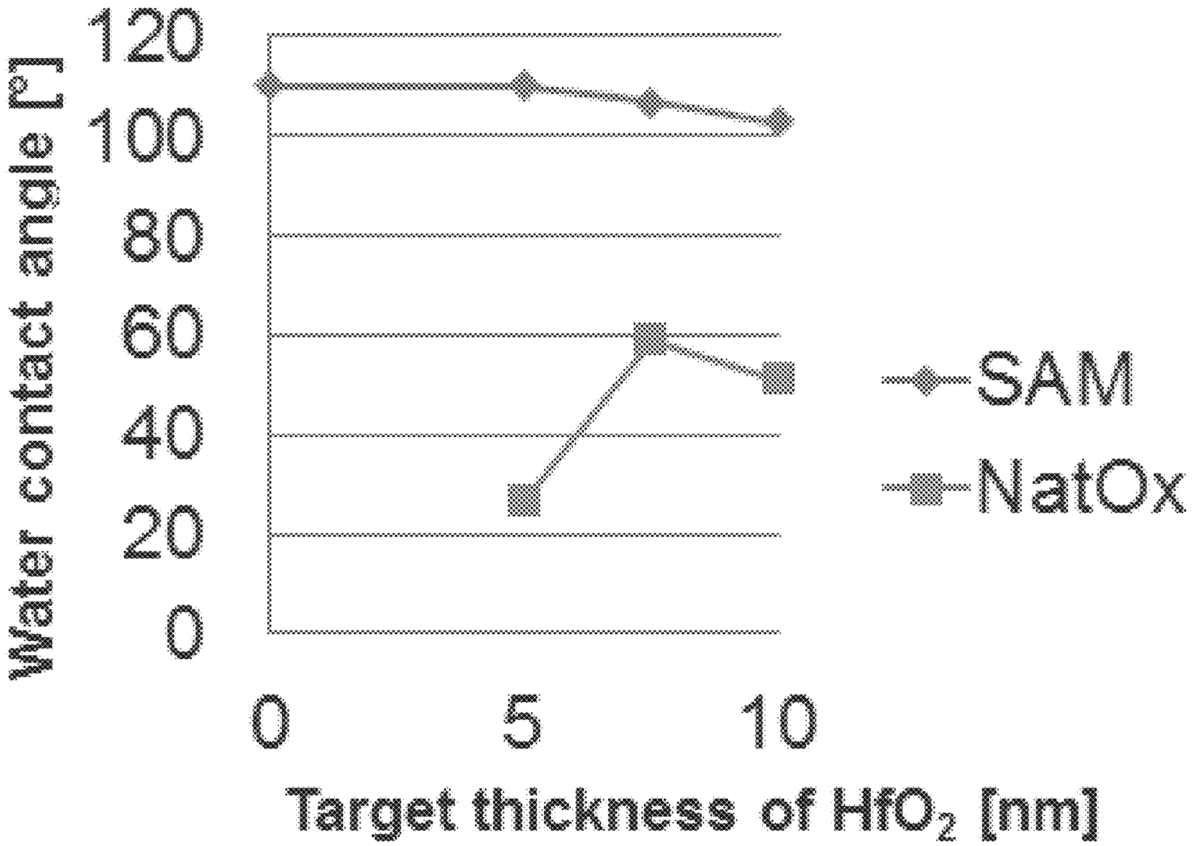
FIG. 9A is a plot showing water contact angle measurements of a first native silicon oxide surface and a second surface comprising a SAM after being subjected to an $HfO_2$ deposition process according to some embodiments as a function of target $HfO_2$ film thickness.

The water contact angle for the surfaces of the coupon substrates was measured before and after the $HfO_2$ deposition process As depicted in FIG. 9A, the contact angle for the SAM layer was very high, about 110°, prior to an $HfO_2$ deposition process, which indicated that the SAM surface comprising —$CH_x$ terminations was highly hydrophobic. The native oxide surface was measured as having a very low contact angle, indicating the hydrophilic nature of the surface comprising Si—OH terminations.

As can be further seen in FIG. 9A, the water contact angle for the SAM surface of the second coupon substrate remained above 100° after being subjected to an $HfO_2$ deposition process with a target thickness of 10 nm. This result indicated that the SAM layer had desirable passivation properties against an $HfO_2$ deposition process including TEMAH as a first precursor and $O_2$ as a second precursor according to some embodiments, thereby allowing for selective $HfO_2$ deposition.

Figure 9B:
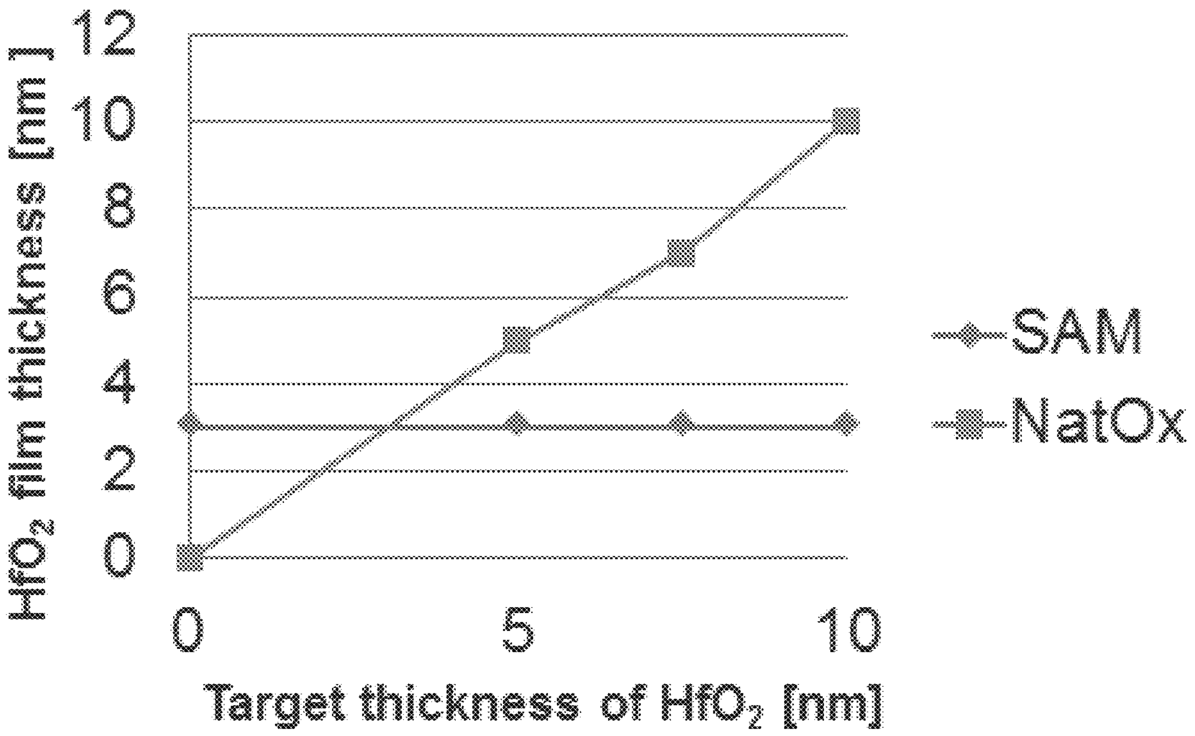
FIG. 9B is a plot showing deposited $HfO_2$ films thickness on a first native silicon oxide surface and a second surface comprising a SAM as function of target $HfO_2$ film thickness.

FIG. 9B shows the thickness of $HfO_2$ material deposited on the first and second coupon substrates by the $HfO_2$ deposition process including $O_2$ as a second precursor. The thickness of material deposited on the SAM layer was found to remain constant, even as the target $HfO_2$ thickness, and thus number of deposition cycles increased. The thickness of $HfO_2$ on the native silicon oxide surface increased linearly with target thickness, as expected, indicating regular deposition of $HfO_2$.

A similar experiment was carried out on the second SAM coupon substrate; however that substrate was subjected to a typical $HfO_2$ deposition process as known in the art including TEMAH as a first precursor and $H_2O$ as a second precursor. The water contact angle for the SAM layer was reduced to 94° after being subjected to an $HfO_2$ deposition process with a target thickness of 6 nm. This $HfO_2$ deposition process had a deposition temperature of 285° C. and included 85 deposition cycles. Prior to the deposition process the SAM layer, formed from a liquid phase on the native silicon oxide surface of the coupon substrate had a water contact angle of 107, indicating that it was high quality.

Figure 10:
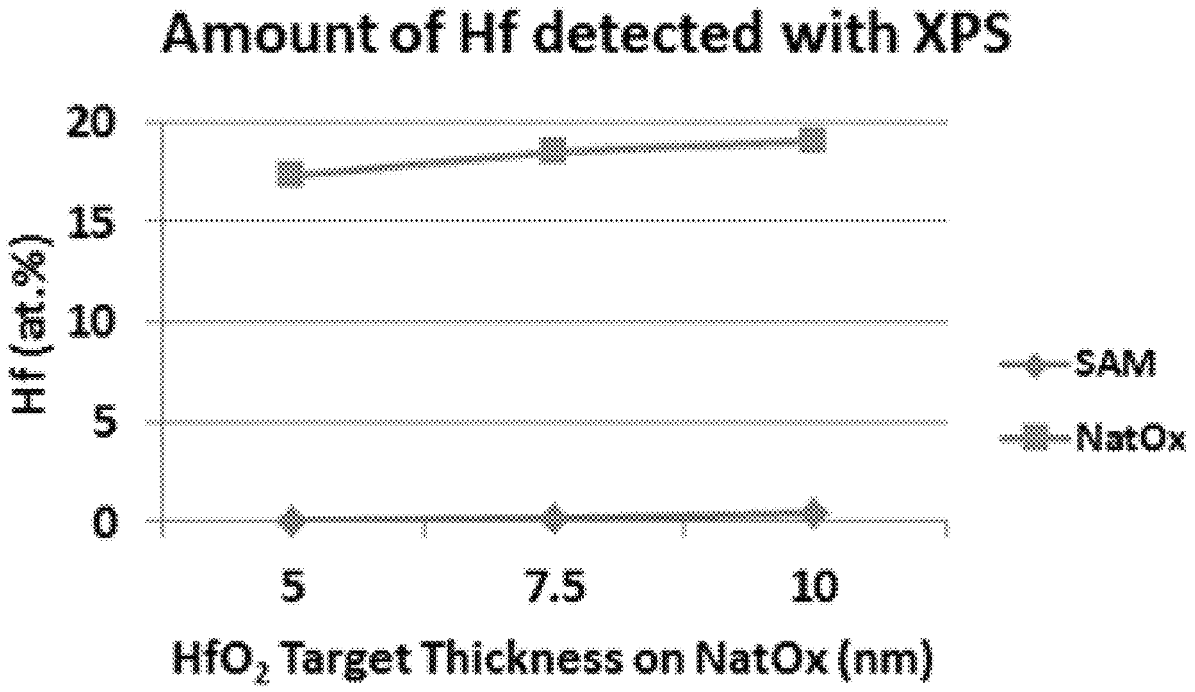
FIG. 10 is a plot showing the amount of Hf (at %) detected via X-ray photoelectron spectroscopy (XPS) as a function of deposited $HfO_2$ target film thickness for a deposition process including $O_2$ as a second precursor according to some embodiments.

As shown in FIG. 10, the thickness of $HfO_2$ material deposited on the first and second coupon substrates using a deposition process including $O_2$ as a second precursor was determined via XPS. The atomic percent of Hf detected by XPS on the native oxide surface of the first coupon substrate increased with increasing target $HfO_2$ thickness, while the atomic percent of Hf on the SAM surface of the second coupon remained approximately zero despite increasing target $HfO_2$ thickness. This result was indicative of desirable passivation properties for the SAM layer against an $HfO_2$ deposition process including TEMAH as a first precursor and $O_2$ as a second precursor according to some embodiments, thereby enabling selective deposition.

Figure 11:
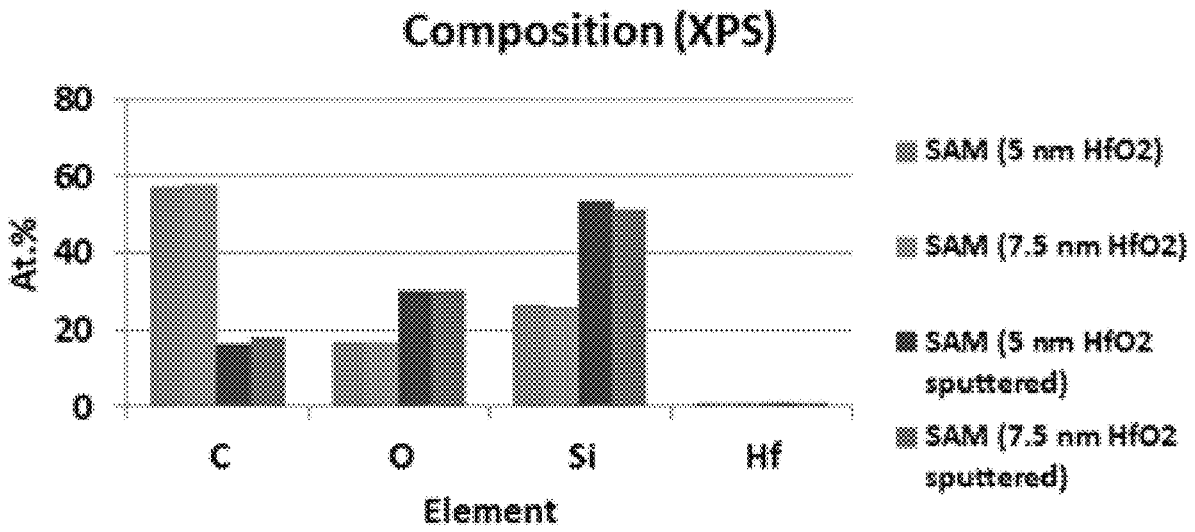
FIG. 11 illustrates the composition (at %) of a surface of a substrate comprising a SAM after being subjected to $HfO_2$ deposition processes including $O_2$ as a second precursor according to some embodiments and after being subsequently subjected to Ar sputtering.

FIG. 11 shows the composition in atomic percent of the SAM surface of the second coupon after being subjected to $HfO_2$ deposition processes including $O_2$ as a second precursor and with target film thicknesses of 5 nm and 7.5 nm. Only very small amounts of Hf, between 0.1 at % and 0.5 at %, were detected on the surface after the deposition processes. The SAM surfaces were also subsequently subjected to 15 seconds of soft Ar sputtering in order to remove some of the SAM surface. After Ar sputtering between 0.18 at % and 0.22 at % Hf was detected on the substrate surface.

As used herein, the term "about" may refer to a value that is within 15%, within 10%, within 5%, or within 1% of a given value.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A reactor, comprising:

a deposition chamber for supporting a substrate;

a metal precursor source connected to the deposition chamber and configured to provide a vapor phase metal precursor;

a sole molecular oxygen ($O_2$) source connected to the deposition chamber and configured to provide molecular oxygen ($O_2$) precursor; and a control system configured to control the reactor to perform operations to deposit a thin film of insulating metal oxide on the substrate, wherein the operations comprise:

supplying the vapor phase metal precursor to the deposition chamber from the metal precursor source such that the vapor phase metal precursor contacts the substrate; and supplying the molecular oxygen ($O_2$) precursor to the deposition chamber from the sole molecular oxygen ($O_2$) source such that the molecular oxygen ($O_2$) precursor contacts the substrate.

2. The reactor of claim 1, wherein the control system is further configured to maintain a deposition temperature to be in a range from about 225° C. to about 400° C.

3. The reactor of claim 1, wherein the thin film comprises magnesium oxide, lanthanum oxide, aluminum oxide, or hafnium oxide.

4. The reactor of claim 1, wherein the thin film comprises a transition metal oxide.

5. The reactor of claim 1, wherein the control system is further configured to control the reactor to perform the operations to selectively deposit the thin film on a first surface of the substrate relative to a second surface of the substrate.

6. The reactor of claim 5, wherein the control system is further configured to supply the molecular oxygen ($O_2$) precursor to minimize degradation of the second surface such that selective deposition from the first surface to the second surface is at least about 50% selective.

7. The reactor of claim 5, wherein the control system is configured to control the reactor such that the molecular oxygen ($O_2$) precursor contacting the substrate does not degrade or oxidize the second surface, and wherein the second surface comprises an organic species.

8. The reactor of claim 5, wherein the control system is configured to control the reactor such that the molecular oxygen ($O_2$) precursor contacting the substrate does not expose an underlying metal below the second surface, and wherein the second surface comprises an organic species.

9. The reactor of claim 1, wherein the vapor phase metal precursor comprises an organometallic compound.

10. The reactor of claim 9, wherein the vapor phase metal precursor comprises bis(cyclopentadienyl)magnesium ($Mg(Cp)_2$), lanthanum formamidinate ($La(FAMD)_3$), or tetramethylethyl alkylamide hafnium (TEMAH).

11. The reactor of claim 1, wherein the operations further comprise:

after supplying the vapor phase metal precursor, removing at least one of excess vapor phase metal precursor or reaction byproducts from the substrate.

12. The reactor of claim 1, wherein the operations further comprise:

after supplying the molecular oxygen ($O_2$) precursor, removing at least one of excess molecular oxygen ($O_2$) precursor or reaction byproducts from the substrate.

13. The reactor of claim 5, wherein the control system is further configured to cause the reactor to cyclically repeat the operations to selectively deposit the thin film.

* * * * *